United States Patent
Takahashi et al.

(10) Patent No.: US 9,741,788 B2
(45) Date of Patent: Aug. 22, 2017

(54) SEMICONDUCTOR DEVICE AND METHOD FOR FABRICATING THE SAME

(71) Applicant: Mitsubishi Electric Corporation, Chiyoda-ku (JP)

(72) Inventors: Tetsuo Takahashi, Chiyoda-ku (JP); Takami Otsuki, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 90 days.

(21) Appl. No.: 14/661,182

(22) Filed: Mar. 18, 2015

(65) Prior Publication Data

US 2015/0194482 A1 Jul. 9, 2015

Related U.S. Application Data

(62) Division of application No. 12/685,180, filed on Jan. 11, 2010, now Pat. No. 8,994,141.

(30) Foreign Application Priority Data

Apr. 6, 2009 (JP) ................................. 2009-092257

(51) Int. Cl.
*H01L 29/66* (2006.01)
*H01L 29/06* (2006.01)
(Continued)

(52) U.S. Cl.
CPC .......... *H01L 29/063* (2013.01); *H01L 29/404* (2013.01); *H01L 29/407* (2013.01);
(Continued)

(58) Field of Classification Search
CPC ... H01L 29/063; H01L 29/404; H01L 29/407; H01L 29/0615; H01L 29/0638; H01L 29/66333; H01L 29/7395; H01L 29/7811
See application file for complete search history.

(56) References Cited

U.S. PATENT DOCUMENTS 4,172,260 A * 10/1979 Okabe ................. H01L 29/7835
257/408
5,864,167 A * 1/1999 Cutter ................. H01L 29/0638
257/487
(Continued)

FOREIGN PATENT DOCUMENTS

DE 10 2004 059 620 A1 8/2005
DE 10 2008 014 014 A1 9/2008
071
(Continued)

OTHER PUBLICATIONS

Kimihiro Muraoka, et al. "Power Semiconductor Device and Power IC Handbook", The Institute of Electrical Engineers of Japan, Jul. 30, 1996, 18 Pages.
(Continued)

*Primary Examiner* — Meiya Li
(74) *Attorney, Agent, or Firm* — Oblon, McClelland, Maier & Neustadt, L.L.P.

(57) ABSTRACT

A semiconductor includes an N-type impurity region provided in a substrate. A P-type RESURF layer is provided at a top face of the substrate in the N-type impurity region. A P-well has an impurity concentration higher than that of the P-type RESURF layer, and makes contact with the P-type RESURF layer at the top face of the substrate in the N-type impurity region. A first high-voltage-side plate is electrically connected to the N-type impurity region, and a low-voltage-side plate is electrically connected to a P-type impurity region. A lower field plate is capable of generating a lower capacitive coupling with the substrate. An upper field plate is located at a position farther from the substrate than the lower field plate, and is capable of generating an upper capacitive coupling with the lower field plate whose capaci-
(Continued)

tance is greater than the capacitance of the lower capacitive coupling.

3 Claims, 18 Drawing Sheets

(51) Int. Cl.
*H01L 29/40* (2006.01)
*H01L 29/739* (2006.01)
*H01L 29/78* (2006.01)

(52) U.S. Cl.
CPC .... *H01L 29/66333* (2013.01); *H01L 29/7395* (2013.01); *H01L 29/7811* (2013.01); *H01L 29/0615* (2013.01); *H01L 29/0638* (2013.01)

(56) References Cited

U.S. PATENT DOCUMENTS

| 5,969,400 | A | 10/1999 | Shinohe et al. |
| 6,177,713 | B1 * | 1/2001 | Aono ................ H01L 29/0619 257/170 |
| 2005/0161761 | A1 | 7/2005 | Hatade |
| 2007/0108533 | A1 | 5/2007 | Sekiguchi et al. |
| 2008/0203496 | A1 | 8/2008 | Takahashi et al. |
| 2008/0224150 | A1 | 9/2008 | Suzuki et al. |

FOREIGN PATENT DOCUMENTS

| JP | 5-190693 | 7/1993 |
| JP | 11-330456 | 11/1999 |
| JP | 2002-231944 | 8/2002 |
| JP | 2002-261283 | 9/2002 |
| JP | 2007-134588 | 5/2007 |
| JP | 2007-227949 | 9/2007 |
| KR | 10-0639692 B1 | 10/2006 |

OTHER PUBLICATIONS

T. Terashima, et al. "Structure of 600V and a New Voltage Sensing Device." 5$^{th}$ International Symposium on Power Semiconductor Devices and IC, 1993, pp. 224-229.

Office Action issued Jan. 19, 2012, in Korean Patent Application No. 10-2010-0020197 (with English-language translation).

Office Action issued May 14, 2013, in Japanese Patent Application No. 2009-092257 with English translation.

German Office Action issued Sep. 27, 2013, in German Patent Application No. 10 2010 011 258.5 (with English translation).

\* cited by examiner

SEMICONDUCTOR DEVICE AND METHOD FOR FABRICATING THE SAME

CROSS-REFERENCE TO RELATED APPLICATIONS

This application is a division of and claims the benefit of priority under 35 U.S.C. §120 from U.S. Ser. No. 12/685,180 filed Jan. 11, 2010, the entire contents of which are incorporated herein by reference.

BACKGROUND OF THE INVENTION

Field of the Invention

The present invention relates to a semiconductor device, and more particularly to a semiconductor device including a termination structure, and a method for fabricating such a semiconductor device.

Description of the Background Art

Power devices are semiconductor elements mainly intended for electric equipment for use in power conversion or power control, and allow for higher breakdown voltages and larger currents than in typical semiconductor devices. Power devices need to sustain a high voltage by cutting off current when a reverse voltage is applied thereto. In order for power devices to withstand higher breakdown voltages, "Handbook of Power Device & Power IC" edited by The Investigation Committee on High-Performance and High-Functionality Power Device & Power IC, The Institute of Electrical Engineers of Japan, and published by Corona Inc. (pp. 54-64 and 170-174) discloses a FLR (Field Limiting Ring) structure and a termination structure such as a field plate structure.

In the FLR structure, a main junction between an N-type impurity region of low concentration and a P-type impurity region located at an internal surface of this N-type impurity region is surrounded by a plurality of ring-shaped P-type impurity regions. With this structure, when a reverse voltage is applied, junctions formed by the respective ring-shaped P-type impurity regions sequentially produce punch-through before the main junction punches through, thereby reducing the electric field of the main junction.

Further, Japanese Patent Laying-Open No. 2002-231944 and Japanese Patent Laying-Open No. 05-190693, for example, disclose a structure including a ring-shaped conductive film provided on each FLR with an insulation film interposed therebetween. With this structure, the conductive films function as equipotential rings, thereby mitigating the influence of movable ions contained in the insulation film.

SUMMARY OF THE INVENTION

With the FLR structure, the electric field is reduced by the N-type impurity regions of low concentration located among the plurality of ring-shaped P-type impurity regions. This causes a problem in that the use of the FLR structure for increasing the breakdown voltage of a semiconductor device will increase the area of a peripheral portion of the main junction, resulting in an increased footprint of the semiconductor device.

Therefore, an object of the present invention is to provide a semiconductor device having a reduced footprint while sustaining a predetermined breakdown voltage, and to provide a method for fabricating such a semiconductor device.

A semiconductor device according to the present invention includes a substrate having a main surface, a first impurity region of a first conductivity type, a RESURF (Reduced Surface Field) layer of a second conductivity type, a second impurity region of the second conductivity type, and a plurality of field plates. The first impurity region is provided in the substrate. The RESURF layer is provided at the main surface in the first impurity region. The second impurity region has an impurity concentration higher than the impurity concentration of the RESURF layer, and is arranged in contact with the RESURF layer at the main surface in the first impurity region. At least one of the plurality of field plates is electrically connected to the first impurity region. At least another one of the plurality of field plates is electrically connected to the second impurity region. The plurality of field plates includes a lower field plate and an upper field plate. The lower field plate is capable of generating a lower capacitive coupling with the substrate. The upper field plate is located at a position farther from the substrate than the lower field plate, and capable of generating an upper capacitive coupling with the lower field plate. The upper capacitive coupling has a capacitance greater than the capacitance of the lower capacitive coupling.

With the semiconductor device and the fabrication method of the semiconductor device according to the present invention, the footprint can be reduced while sustaining a predetermined breakdown voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below with reference to the accompanied drawings.

First Embodiment

Figure 1:
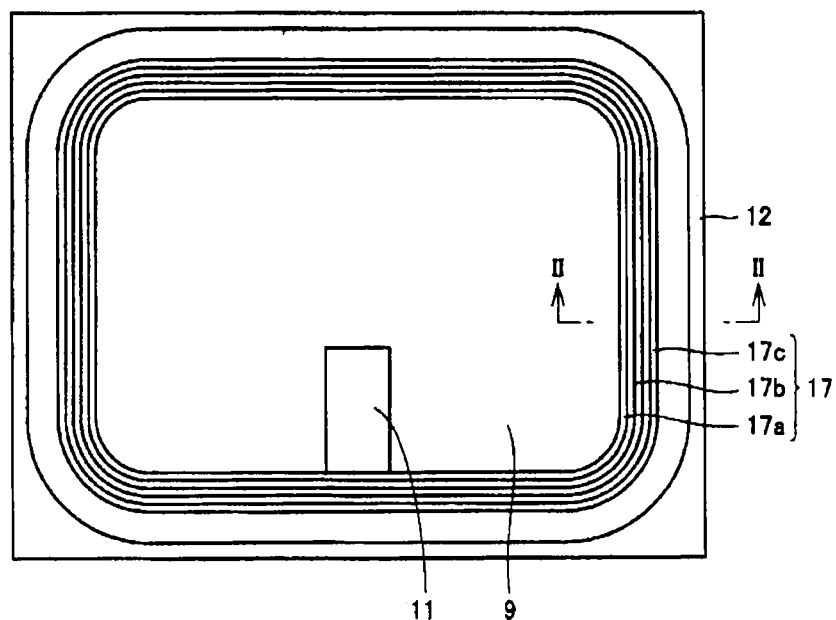
FIG. 1 is a plan view schematically showing a structure of a semiconductor device according to a first embodiment of the present invention.
Figure 2:
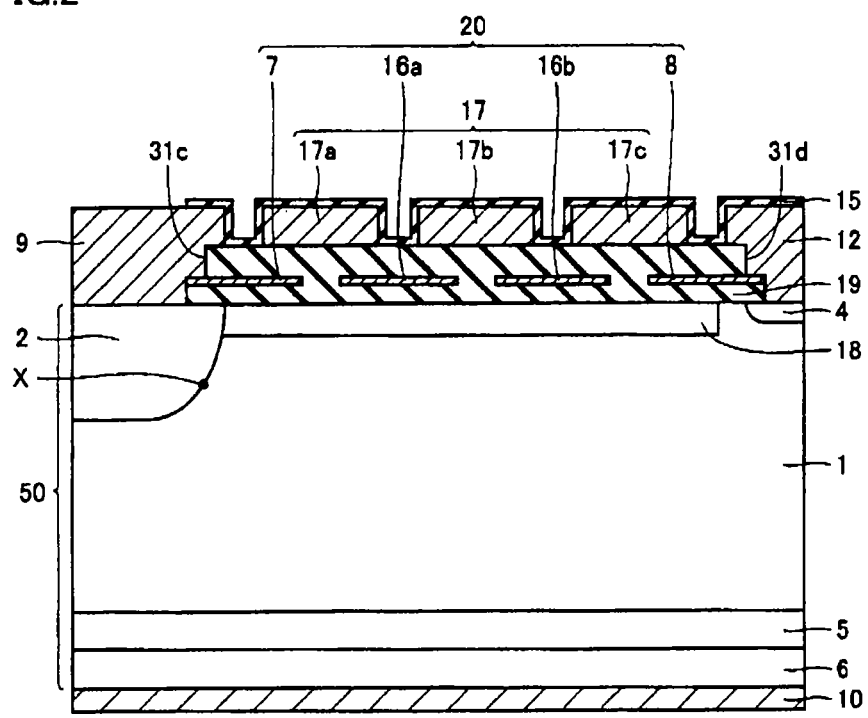
FIG. 2 is a sectional view taken along the line II-II of FIG. 1.

With reference to FIGS. 1 and 2, a semiconductor device according to the present embodiment includes a substrate 50 having a top face (main surface), as well as an IGBT (Integrated Gate Bipolar Transistor) and a termination structure formed at substrate 50. Substrate 50 is made of, for example, silicon.

The semiconductor device according to the present embodiment includes, as the termination structure, an N-type impurity region 1 (first impurity region), a P-type RESURF (Reduced Surface Field) layer 18, a P-well 2 (second impurity region), an N-type channel stopper region 4, and upper and lower field plates 17 and 20 as a plurality of field plates. N-type impurity region 1 is provided in substrate 50. P-type RESURF layer 18, P-well 2 and N-type channel stopper region 4 are located at the top face of substrate 50 in N-type impurity region 1. P-type RESURF layer 18 is located at the middle position in FIG. 2, and has an impurity concentration selected to satisfy a concentration condition (RESURF condition) that achieves full depletion. P-well 2 is in contact with and located on the left side of P-type RESURF layer 18 in FIG. 2. P-well 2 has a P-type impurity concentration higher than that of P-type RESURF layer 18. N-type impurity region 1 is interposed between N-type channel stopper region 4 and P-type RESURF layer 18 on substrate 50. N-type channel stopper region 4 is located at the right end in FIG. 2. N-type channel stopper region 4 has an N-type impurity concentration higher than that of N-type impurity region 1.

Formed on the top face of substrate 50 is an interlayer insulation film 19. Interlayer insulation film 19 has openings 31 c and 31 d extending therethrough to reach P-well 2 and N-type channel stopper region 4, respectively. An emitter electrode 9 is provided in opening 31 c, and a channel stopper electrode 12 is provided in opening 31 d. Also provided in interlayer insulation film 19 is lower field plate 20. Lower field plate 20 includes plates 7, 16a, 16b and 8. Plates 7, 16a, 16b and 8 are arranged substantially in parallel to the top face of substrate 50 in this order from P-well 2 to N-type channel stopper region 4 (rightward in FIG. 2) as viewed in a plan view. Plate 7 (first low-voltage-side plate) is electrically connected to P-well 2 through emitter electrode 9. Plate 7, as viewed in a plan view, extends toward P-type RESURF layer 18 (rightward in FIG. 2) beyond the boundary between P-type RESURF layer 18 and P-well 2 at the top face of substrate 50. Plate 8 (first high-voltage-side plate) is electrically connected to N-type channel stopper region 4 (N-type impurity region 1) through channel stopper electrode 12. Plate 8, as viewed in a plan view, extends toward P-type RESURF layer 18 (leftward in FIG. 2) beyond the boundary between N-type impurity region 1 and P-type RESURF layer 18 at the top face of substrate 50. Plates 7, 16a, 16b and 8 are insulated from one another, and plates 16a and 16b each have a floating potential.

Provided on interlayer insulation film 19 is upper field plate 17. Upper field plate 17 includes plates 17a to 17c. Plates 17a to 17c are arranged substantially in parallel to the top face of substrate 50 in this order from P-well 2 to N-type channel stopper region 4, as viewed in a plan view. Plates 17a to 17c are located at a position farther from substrate 50 than plates 7, 16a, 16b and 8. Plates 17a to 17c are insulated from one another, and each have a floating potential. Provided on emitter electrode 9, interlayer insulation film 19 and channel stopper electrode 12 is a passivation film 15 so as to cover each of plates 17a to 17c.

Figure 3:
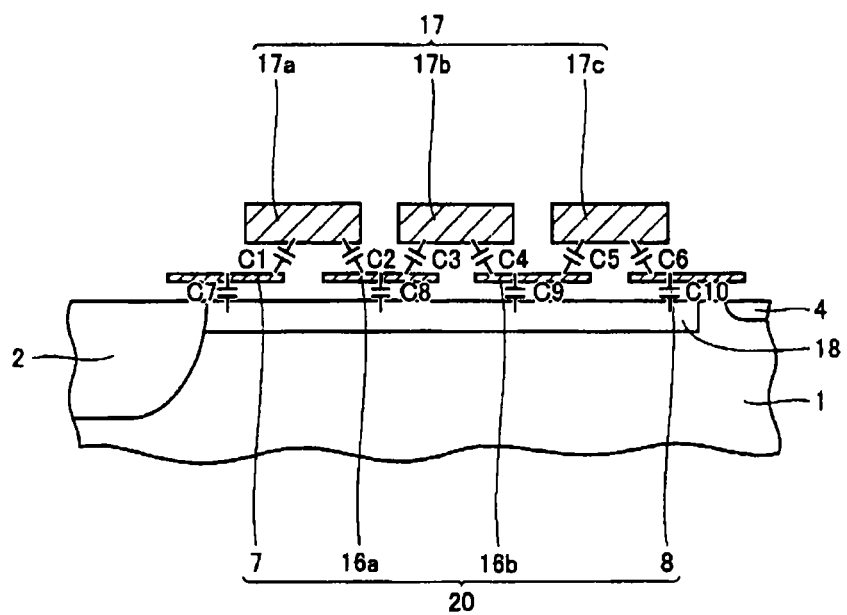
FIG. 3 is a sectional view schematically showing capacitive couplings generated by plates in the semiconductor device according to the first embodiment of the present invention.

With reference to FIG. 3, plate 17a faces a region of each of plates 7 and 16a to generate a capacitive coupling of capacitance C1 with plate 7 and a capacitive coupling of capacitance C2 with plate 16a. Similarly, plate 17b faces a region of each of plates 16a and 16b to generate a capacitive coupling of capacitance C3 with plate 16a and a capacitive coupling of capacitance C4 with plate 16b. Plate 17c faces a region of each of plates 16b and 8 to generate a capacitive coupling of capacitance C5 with plate 16b and a capacitive coupling of capacitance C6 with plate 8. Further, plates 7, 16a, 16b and 8 generate capacitive couplings of capacitances C7 to C10 with substrate 50, respectively. Capacitances C1 to C6 of the capacitive couplings (upper capacitive couplings) generated by upper field plate 17 and lower field plate 20 are all greater than capacitances C7 to C10 of the capacitive couplings (lower capacitive couplings) generated by lower field plate 20 and substrate 50.

Although the semiconductor device according to the present embodiment includes other capacitive couplings (e.g., a capacitive coupling generated by plate 17a and substrate 50) in addition to those mentioned above, the presence of such capacitive couplings is negligible because their capacitances are sufficiently smaller than capacitances C1 to C10 of the aforementioned capacitive couplings.

With reference to FIGS. 1 and 2, an IGBT is formed in the aforementioned termination structure. The IGBT includes a gate electrode 11, emitter electrode 9, N-type impurity region 1, an N-type buffer region 5, a P-type collector region 6 and a collector electrode 10. Gate electrode 11 and emitter electrode 9 are located at the top face (main surface) of substrate 50. Gate electrode 11 is located at a lower middle position of substrate 50 in FIG. 1. Emitter electrode 9 is located around gate electrode 11 in FIG. 1. Collector electrode 10 is located at the bottom face of substrate 50. N-type impurity region 1, N-type buffer region 5, and P-type collector region 6 are disposed within substrate 50. N-type impurity region 1 is provided entirely across substrate 50. N-type buffer region 5 is disposed under N-type impurity region 1 in FIG. 2. P-type collector region 6 is disposed under N-type buffer region 5 in FIG. 2.

Figure 4A:
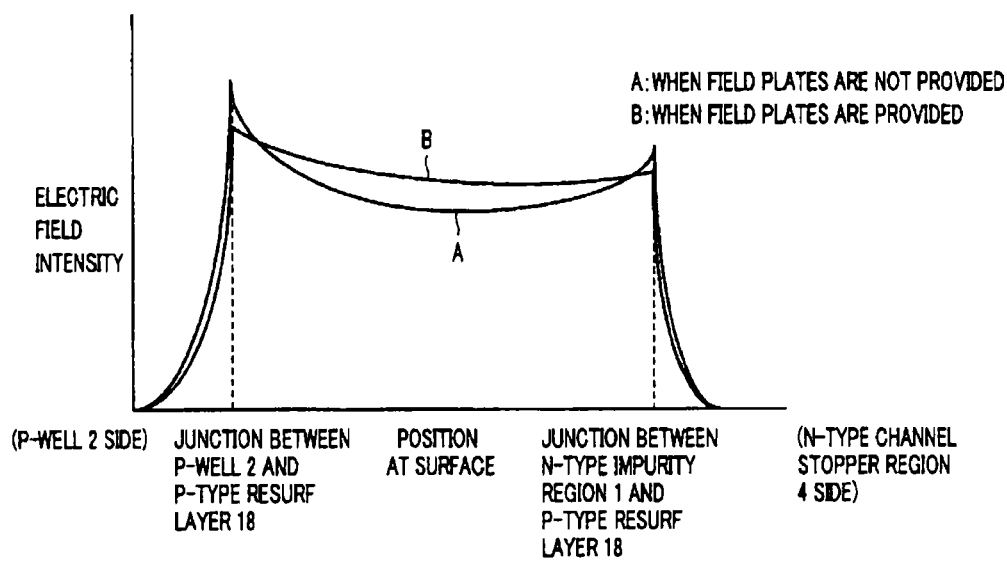
FIG. 4A schematically shows electric field distributions at a surface of a substrate according to the first embodiment of the present invention.
Figure 4B:
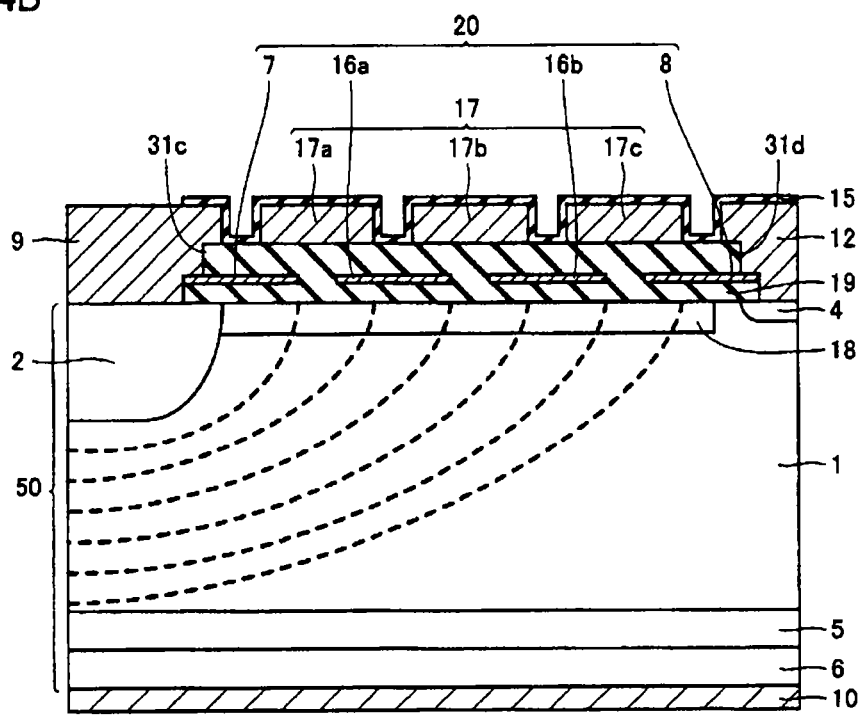
FIG. 4B schematically shows equipotential lines in the substrate according to the first embodiment of the present invention.

The principle on which the semiconductor device according to the present embodiment sustains a reverse voltage will now be described. With reference to FIGS. 3, 4A and 4B, when collector electrode 10 has a higher potential than emitter electrode 9 (that is, when a reverse voltage is applied), a voltage is applied to the junction between N-type impurity region 1 and P-type RESURF layer 18 at the top face of substrate 50 (or the junction between N-type channel stopper region 4 and P-type RESURF layer 18 in the case where N-type channel stopper region 4 and P-type RESURF layer 18 are joined to each other), causing a depletion layer to extend from the side of N-type channel stopper region 4 (high-voltage side) to the side of P-well 2 (low-voltage side). At this stage, if the impurity concentration of P-type RESURF layer 18 is controlled properly, P-type RESURF layer 18 is fully depleted by the depletion layer extending from the junction between the bottom of P-type RESURF layer 18 and N-type impurity region 1 to the surface of substrate 50, before the electric field of this junction exceeds a critical point and breaks down. As a result, the reverse voltage is sustained by the depletion layer provided entirely across P-type RESURF layer 18.

When the depletion layer is formed entirely across P-type RESURF layer 18, the electric field intensity in the depletion layer is actually unlikely to present a uniform distribution. Assuming that no field plate is provided, the electric field will be concentrated on the junction between P-well 2 and P-type RESURF layer 18 and the junction between P-type RESURF layer 18 and N-type impurity region 1. Since avalanche breakdown is more likely to occur at these positions where the electric field is concentrated than at other positions, which will result in a reduced breakdown voltage. Therefore, in the present embodiment, the field plates (particularly, lower field plate 20) having a controlled potential give an electric influence upon the surface of substrate 50, thereby relaxing the electric field concentration at the two junctions, as indicated by the curve B in FIG. 4A. As a result, when a reverse voltage is applied, the electric field has a uniform distribution that presents equally spaced equipotential lines as indicated by broken lines in FIG. 4B, to achieve improved breakdown voltage.

Each of plates 7, 16a, 16b, 8 and 17a to 17c constituting the field plates can be controlled in potential by selecting capacitances C1 to C6 of the capacitive couplings. More specifically, a charge Q of a capacitive coupling is a product of capacitance C and voltage V as expressed by Equation (1) as follows:

$$Q = C \times V \qquad (1)$$

Since each of plates 7, 16a, 16b, 8 and 17a to 17c has a constant charge Q, voltage V between two plates generating a capacitive coupling decreases as capacitance C increases.

Figure 5A:
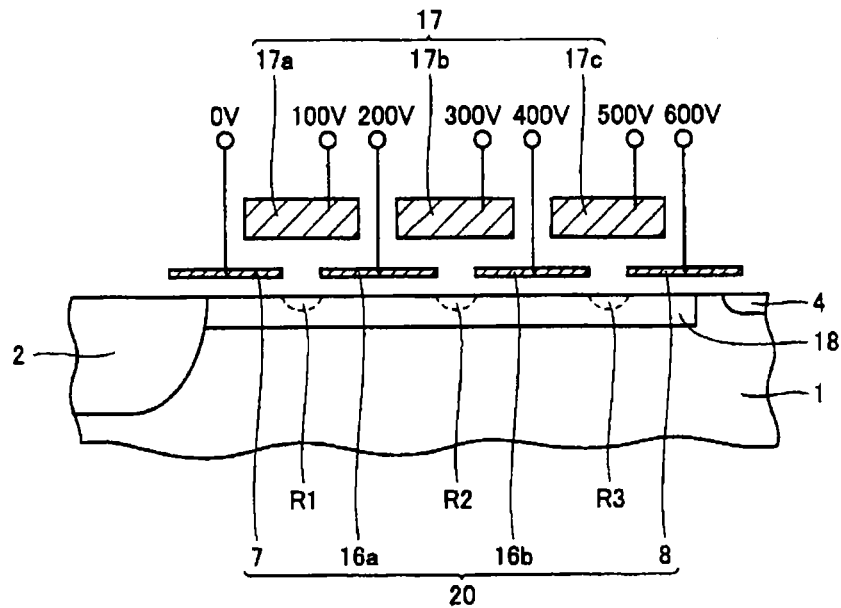
FIG. 5A shows an example of potential control of respective field plates when a voltage of 600V is applied across a P-well 2 and an N-type channel stopper region 4.

With reference to FIGS. 3 and 5A, selecting capacitances C1 to C6 (FIG. 3) to be, for example, identical with one another will increase plates 7, 16a, 16b, 8 and 17a to 17c in potential at a certain rate from P-well 2 to N-type channel stopper region 4. For example, plate 7 is at a potential of 0V, plate 17a at 100V, plate 16a at 200V, plate 17b at 300V, plate 16b at 400V, plate 17c at 500V, and plate 8 at 600V. With such control of potentials, the electric field intensity of a region R1 between plates 7 and 16a at the surface of substrate 50, that of a region R2 between plates 16a and 16b and that of a region R3 between plates 16b and 8 are alleviated to the same degree.

Figure 5B:
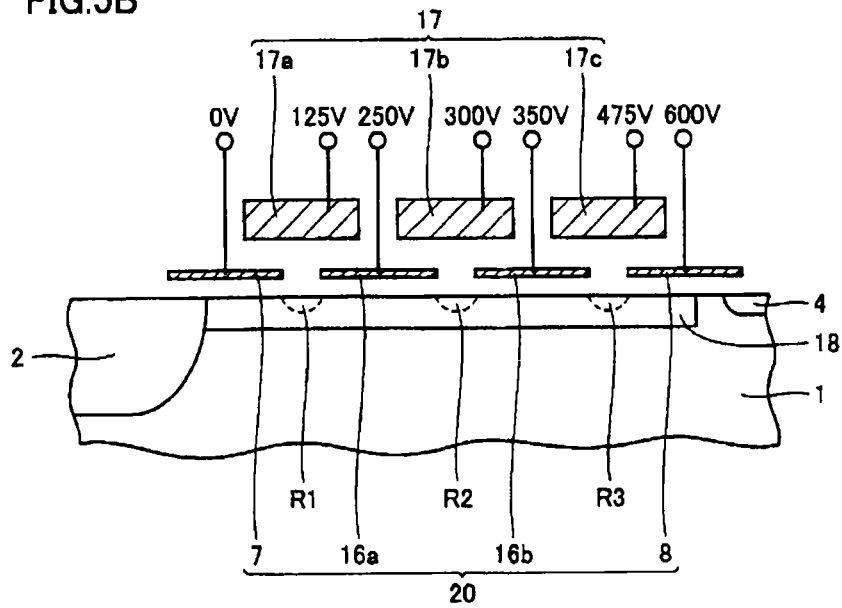
FIG. 5B shows another example of potential control of respective field plates when a voltage of 600V is applied across a P-well 2 and an N-type channel stopper region 4.

With reference to FIGS. 3 and 5B, when capacitances C1, C2, C5 and C6 are selected to be smaller than capacitances C2 and C3, a potential difference V1 between plates 7 and 17a, a potential difference V2 between plates 17a and 16a, a potential difference V5 between plates 16b and 17c and a potential difference V6 between plates 17c and 8 are greater than a potential difference V3 between plates 16a and 17b and a potential difference V4 between plates 17b and 16b. For example, plate 7 is at a potential of 0V, plate 17a at 125V, plate 16a at 250V, plate 17b at 300V, plate 16b at 350V, plate 17c at 475V, and plate 8 at 600V. With such control of potentials, the electric field intensity of region R1 and that of region R3 are lowered significantly as compared to that of region R2.

Herein, since capacitances C1 to C6 of the capacitive couplings generated between upper field plate 17 and field plate lower 20 are greater than capacitances C7 to C10 generated between lower field plate 20 and substrate 50, the field plates are prevented from receiving an influence of the electric field at the surface of substrate 50 which would cause potential variations. This in result allows the potentials of plates 7, 16a, 16b, 8 and 17a to 17c to be controlled as described above.

The semiconductor device according to the present embodiment sustains a reverse voltage by the depletion layer formed entirely across P-type RESURF layer 18, while relaxing the electric field concentration in the depletion layer by virtue of upper field plate 17 and field plate lower 20. Since there is no need to provide a plurality of ring-shaped P-type impurity regions in order to sustain a predetermined breakdown voltage, the footprint can be reduced while sustaining a predetermined breakdown voltage.

Since plate 7 extends toward P-type RESURF layer 18 beyond the boundary between P-type RESURF layer 18 and P-well 2 at the top face of substrate 50, the electric field concentration on the junction between P-well 2 and P-type RESURF layer 18 can be particularly relaxed by the electric field exerted by plate 7.

Since plate 8 extends toward P-type RESURF layer 18 beyond the boundary between N-type impurity region 1 and P-type RESURF layer 18 at the top face of substrate 50, the electric field concentration on the junction between P-type RESURF layer 18 and N-type impurity region 1 can be particularly relaxed by the electric field exerted by plate 8.

Alternatively, N-type impurity region 1 may include N-type channel stopper region 4. In this case, N-type channel stopper region 4 has an impurity concentration relatively higher than that of the remaining portion of N-type impurity region 1 outside N-type channel stopper region 4. That is, in this case, N-type impurity region 1 includes N-type channel stopper region 4 having a relatively high impurity concentration.

Although the present embodiment shows plate 7 being electrically connected to P-well 2, at least one of the plurality of field plates only needs to be electrically connected to P-well 2. Similarly, it is shown that plate 8 is electrically connected to N-type impurity region 1. However, at least one of the plurality of field plates only needs to be electrically connected to N-type impurity region 1. Further, N-type channel stopper region 4 may or may not be provided.

Second Embodiment

Figure 6:
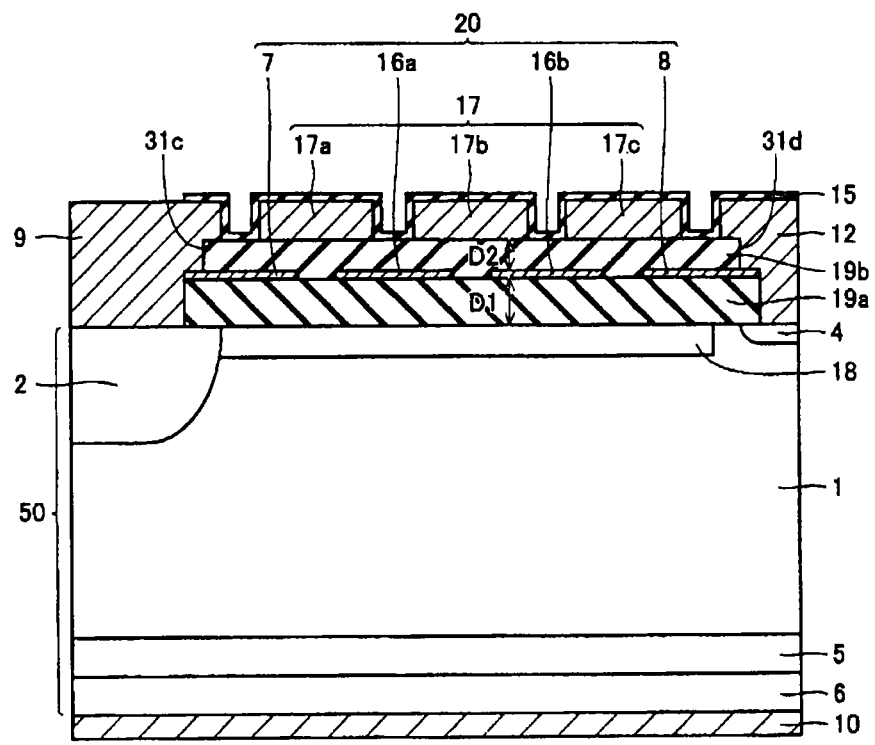
FIG. 6 is a sectional view schematically showing a structure of a semiconductor device according to a second embodiment of the present invention.

With reference to FIG. 6, a semiconductor device according to the present embodiment is different from that of the first embodiment in that interlayer insulation film 19 includes insulation films 19a and 19b.

Insulation film 19a (lower dielectric film) is located between substrate 50 and lower field plate 20. Insulation film 19b (upper dielectric film) is located between lower field plate 20 and upper field plate 17. Insulation film 19a has a thickness D1 greater than a thickness D2 of insulation film 19b. Preferably, insulation films 19a and 19b are made of different materials from each other, and insulation film 19b has a dielectric constant ∈2 greater than a dielectric constant ∈1 of insulation film 19a.

The remaining structure of the semiconductor device is similar to that of the semiconductor device according to the first embodiment. Like reference characters denote like parts throughout the drawings, and the same description will not be repeated.

An example of a fabrication method of the semiconductor device according to the present embodiment will now be described with reference to FIGS. 7 to 14.

Figure 7:
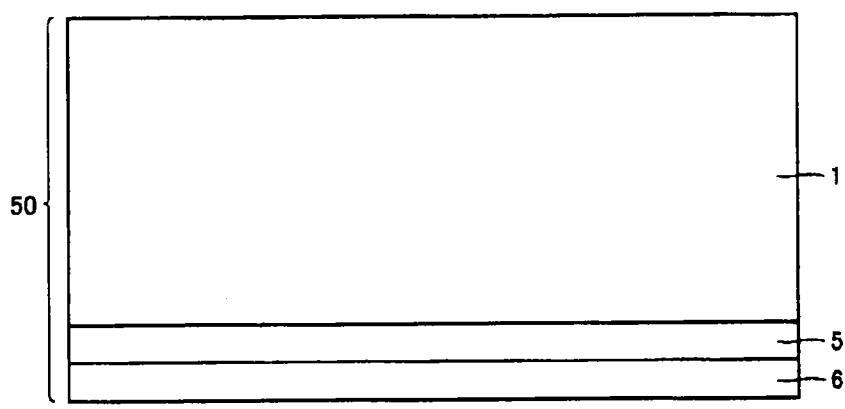
FIGS. 7 to 14 are sectional views respectively showing first to eighth steps of a fabrication method of the semiconductor device according to the second embodiment of the present invention.

First, with reference to FIG. 7, N-type impurity region 1 is provided in substrate 50. Substrate 50 is then doped with N- and P-type impurity ions from the bottom side of substrate 50, thereby generating N-type buffer region 5 and P-type collector region 6.

Figure 8:
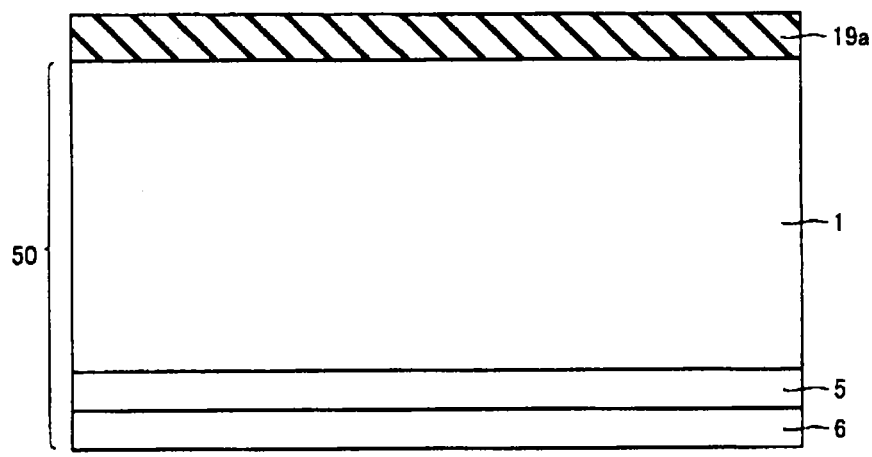

With reference to FIG. 8, insulation film 19a is then provided on the top face of substrate 50 by thermal oxidation, CVD (Chemical Vapor Deposition) or the like.

Figure 9:
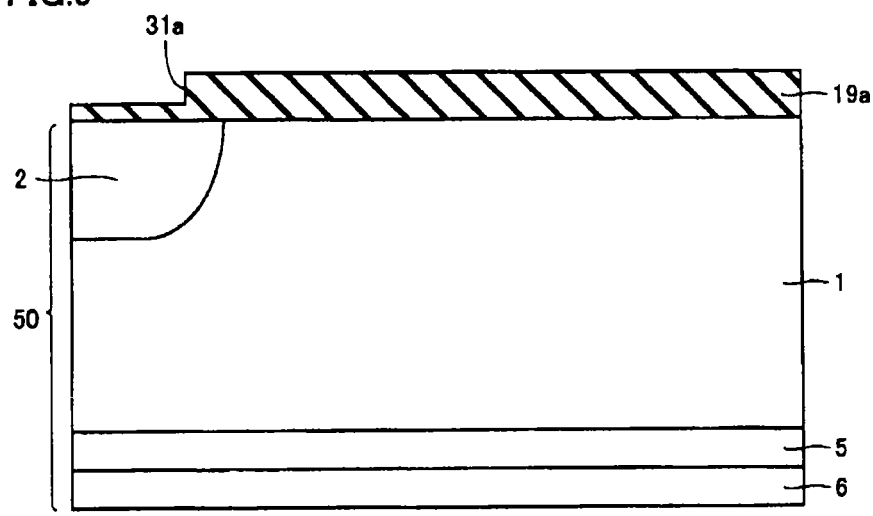

With reference to FIG. 9, insulation film 19a is selectively etched by typical photolithography and etching, thereby forming opening 31a in insulation film 19a at a position where opening 31c (FIG. 6) is to be formed. At the bottom of opening 31a, substrate 50 may be exposed, or insulation film 19a may be left. A predetermined region at the surface of substrate 50 is then selectively doped with P-type impurity ions by typical photolithography, and substrate 50 is subjected to a heat treatment. P-well 2 is thereby formed at the surface of substrate 50.

Figure 10:
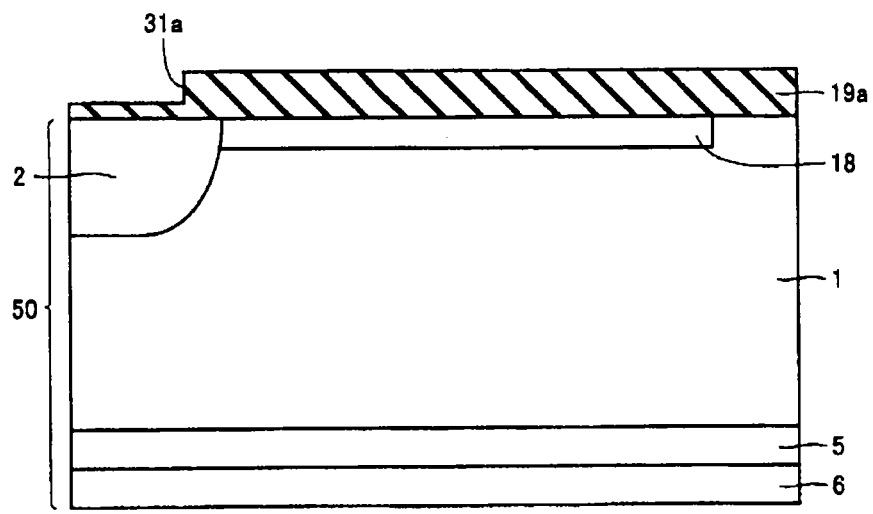

With reference to FIG. 10, a predetermined region is then selectively doped with P-type impurity ions by typical photolithography. The P-type impurity ions transmit through insulation film 19a to be introduced into the surface of substrate 50. Substrate 50 is then subjected to a heat treatment. P-type RESURF layer 18 is thereby formed at the surface of substrate 50.

Figure 11:
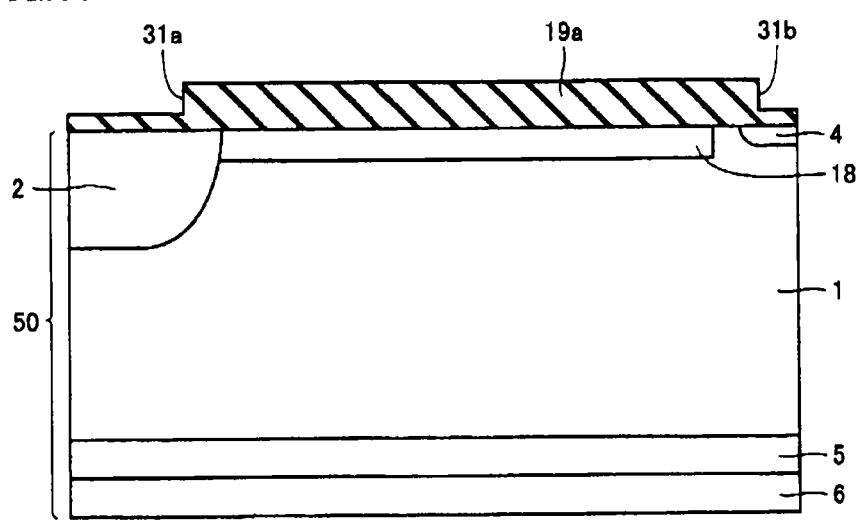

With reference to FIG. 11, insulation film 19a is selectively etched by typical photolithography and etching, thereby forming opening 31b in insulation film 19a at a position where opening 31d (FIG. 6) is to be formed. At the bottom of opening 31b, substrate 50 may be exposed, or insulation film 19a may be left. A predetermined region at the surface of substrate 50 is then selectively doped with N-type impurity ions by typical photolithography, and substrate 50 is subjected to a heat treatment. N-type channel stopper region 4 is thereby formed at the surface of substrate 50.

Figure 12:
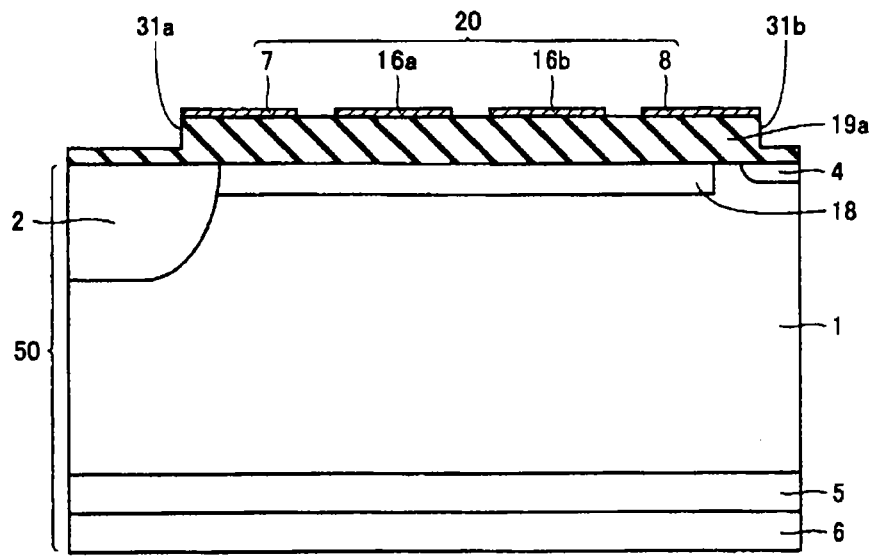

With reference to FIG. 12, lower field plate 20 (plates 7, 16a, 16b and 8) is formed on the top face of insulation film 19a. Plates 7, 16a, 16b and 8 are each made of, for example, a conductive member doped with impurities. When forming, for example, a device such as a MOS (Metal Oxide Semiconductor) transistor in the termination structure of the semiconductor device according to the present embodiment, plates 7, 16a, 16b and 8 may each be formed in the same step in which the gate portion (e.g., gate electrode 11 shown in FIG. 1) is formed. This achieves simplified fabrication steps.

Figure 13:
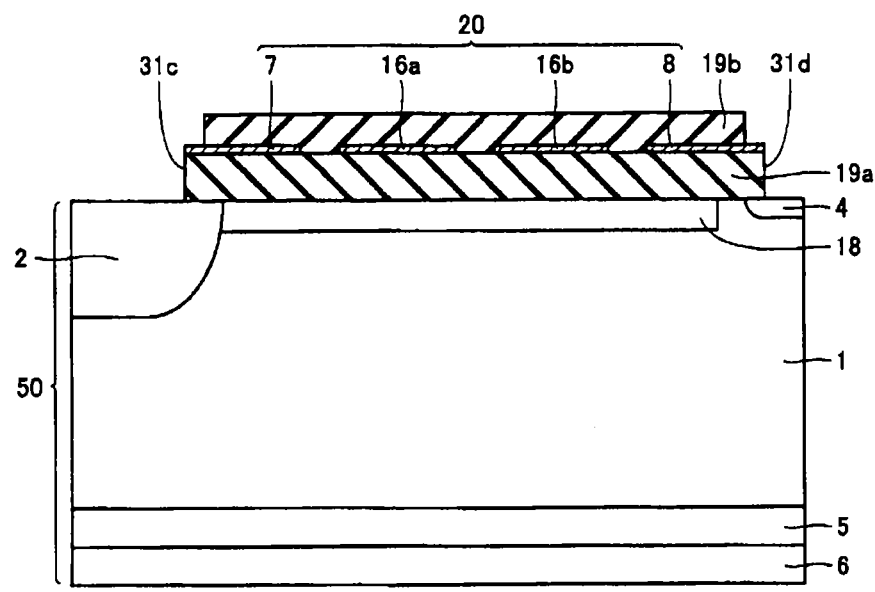

With reference to FIG. 13, insulation film 19b is provided on insulation film 19a by CVD, for example, so as to cover lower field plate 20. Insulation film 19b is then etched by typical photolithography and etching to form openings 31c and 31d. As a result, a portion of plate 7, a portion of plate 8, P-well 2 and N-type channel stopper region 4 are exposed. It should be noted that, when insulation film 19b is made of the same material as insulation film 19a, an insulation film similar to that of the semiconductor device according to the first embodiment is obtained.

Figure 14:
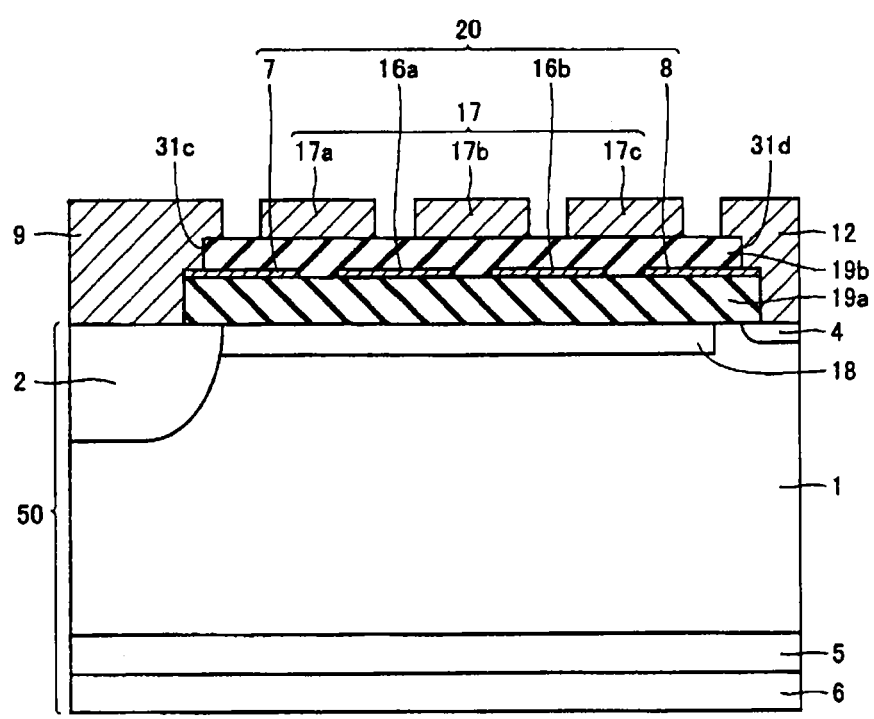

With reference to FIG. 14, a conductive film made of metal such as aluminum is deposited by vapor deposition, sputtering or the like. The conductive film is provided on insulation film 19b so as to fill openings 31c and 31d. This conductive film is then selectively etched by typical photolithography and etching, thereby forming upper field plate (plates 17a to 17c) at the top face of insulation film 19b, emitter electrode 9 in opening 31 c, and channel stopper electrode 12 in opening 31 d. Insulation film 19b is exposed among emitter electrode 9, plates 17a to 17c and channel stopper electrode 12.

Finally, with reference to FIG. 6, an insulation or semi-insulation film to serve as passivation film 15 is provided on the top and side faces of each of emitter electrode 9, plates 17a to 17c and channel stopper electrode 12, as well as on the exposed top face of insulation film 19b. This film is then selectively etched by typical photolithography and etching, thereby forming passivation film 15. Subsequently, collector electrode 10 is formed at the bottom side of substrate 50. Through the above-described steps, the semiconductor device according to the present embodiment is completed.

The semiconductor device and the fabrication method thereof according to the present embodiment achieve effects similar to those of the semiconductor device according to the first embodiment. In addition, forming interlayer insulation film 19 of insulation films 19a and 19b facilitates independent selection of capacitances C1 to C6 (FIG. 3) of the capacitive couplings generated by upper field plate 17 and lower field plate 20 from capacitances C7 to C10 (FIG. 3) of the capacitive couplings generated by lower field plate 20 and substrate 50.

An electric capacitance C of a parallel-plate capacitor is expressed by the following Equation (2) using distance D between parallel plates, area S of the parallel plates and dielectric constant c of an insulator between the parallel plates:

$$C = \in \times S/D \qquad (2)$$

As is clear from Equation (2), capacitance C of a capacitive coupling is inversely proportional to distance D between the parallel plates, and is proportional to dielectric constant ∈ of the insulator between the parallel plates. Therefore, by selecting distance D1 to be greater than distance D2 and dielectric constant ∈2 to be greater than dielectric constant ∈1, capacitances C1 to C6 of the capacitive couplings generated by upper field plate 17 and lower field plate 20 can be made greater than capacitances C7 to C10 of the capacitive couplings generated by lower field plate 20 and substrate 50. The process and structure can be provided with flexibility such that, for example, particularly selecting dielectric constant ∈2 to be greater than dielectric constant ∈1 relatively reduces the thickness of insulation film 19a.

In the present invention, only thicknesses D1 and D2 need to satisfy the above relation (D1>D2), or only dielectric constants ∈1 and ∈2 need to satisfy the above relation (∈2>∈1).

Third Embodiment

Figure 15:
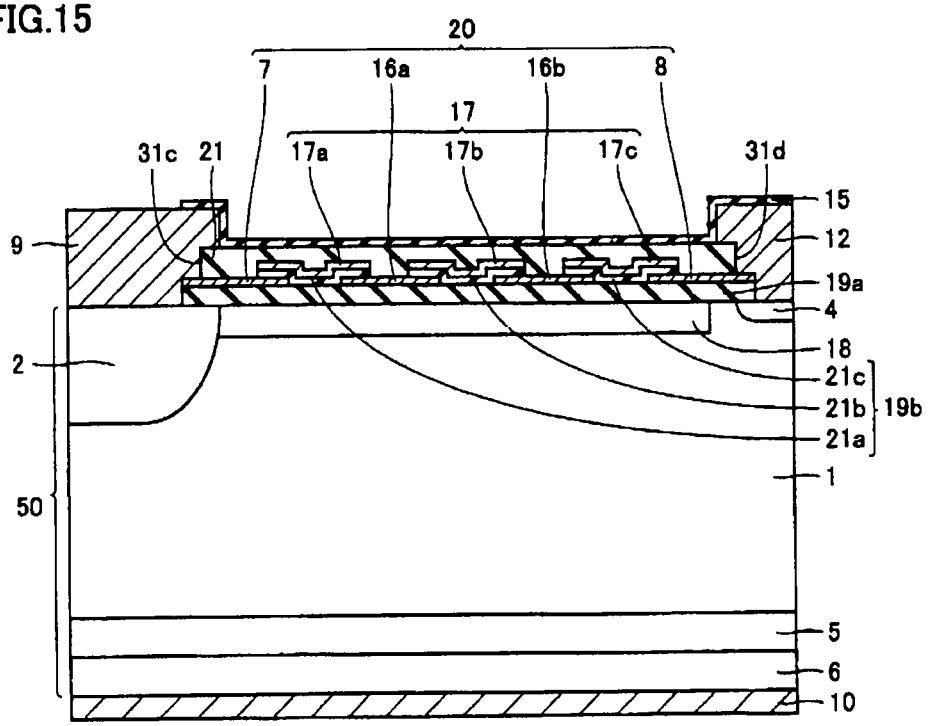
FIG. 15 is a sectional view schematically showing a structure of a semiconductor device according to a third embodiment of the present invention.

With reference to FIG. 15, a semiconductor device according to the present embodiment is different from that of the second embodiment mainly in the structures of insulation film 19b and plates 17a to 17c.

At the top face of plates 16a and 16b, insulation film 19b is divided into three insulation films 21a to 21c. Insulation films 21a to 21c are identical in shape with plates 17a to 17c, respectively, as viewed in a plan view. Insulation film 21a and plate 17a are located between plates 7 and 16a. Insulation film 21b and plate 17b are located between plates 16a and 16b. Insulation film 21 c and plate 17c are located between plates 16b and 16c. An interlayer insulation film 21 is provided on plates 7, 16a, 16b and 8 so as to cover each of insulation films 21a to 21c and plates 17a to 17c. Passivation film 15 is provided on interlayer insulation film 21.

The remaining structure of the semiconductor device is similar to that of the semiconductor device according to the second embodiment. Like reference characters denote like parts throughout the drawings, and the same description will not be repeated.

The semiconductor device according to the present embodiment achieves effects similar to those of the semiconductor device according to the second embodiment. In addition, since insulation film 19a is made of silicon oxide and insulation film 19b is made of silicon nitride, dielectric constant ∈2 of capacitances C1 to C6 (FIG. 3) of the capacitive couplings generated by upper field plate 17 and lower field plate 20 can be made greater than dielectric constant ∈1 of capacitances C7 to C10 (FIG. 3) of the capacitive couplings generated by lower field plate 20 and substrate 50.

Further, the provision of interlayer insulation film 21 so as to cover each of plates 17a to 17c and the provision of passivation film 15 on interlayer insulation film 21 contours passivation film 15 to fit the top face of interlayer insulation film 21, which facilitates planarization of the top face of passivation film 15. This in result prevents degradation in the breakdown voltage which would be caused by "aluminum slide" due to thermal stress or the like. The aluminum slide is a phenomenon in which aluminum wiring is displaced, and likely to occur particularly at chip corners. The aluminum slide may cause defects such as broken wires or shorting.

Fourth Embodiment

Figure 16:
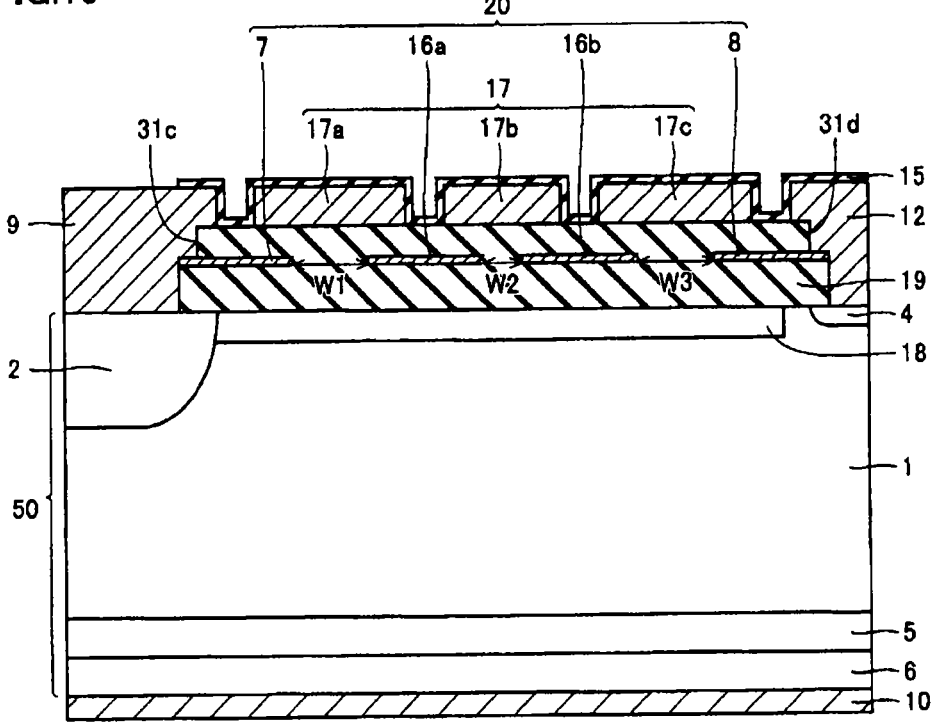
FIG. 16 is a sectional view schematically showing a structure of a semiconductor device according to a fourth embodiment of the present invention.

With reference to FIG. 16, a semiconductor device according to the present embodiment is different from that of the first embodiment in that plates 7, 16a, 16b and 8 constituting lower field plate 20 are spaced at different intervals.

In lower field plate 20, plate 7 (first low-voltage-side plate) electrically connected to P-well 2 is assumed to be at a distance W1 from plate 16a (second low-voltage-side and third high-voltage-side plate) adjacent to plate 7 at a position farther from P-well 2 than plate 7 (rightward in FIG. 2). Plate 16a is assumed to be at a distance W2 from plate 16b (third low-voltage-side and second high-voltage-side plate) adjacent to plate 16a at a position farther from P-well 2 than plate 16a. Further, in lower field plate 20, plate 8 (first high-voltage-side plate) electrically connected to N-type impurity region 1 is assumed to be at a distance W3 from plate 16b adjacent to plate 8 at a position closer to P-well 2 than plate 8 (leftward in FIG. 2). Distances W1 and W3 are each greater than distance W2.

The remaining structure of the semiconductor device is similar to that of the semiconductor device according to the second embodiment. Like reference characters denote like parts throughout the drawings, and the same description will not be repeated.

The semiconductor device according to the present embodiment achieves effects similar to those of the semiconductor device according to the first embodiment. In addition, since region R1 (FIGS. 5A and 5B) between plates 7 and 16a at the surface of substrate 50 is in proximity to the junction between P-well 2 and P-type RESURF layer 18 on which the electric field is concentrated, the electric field concentration on region R1 can be effectively relaxed by selecting distance W1 >distance W2. Similarly, since region R3 (FIGS. 5A and 5B) between plates 16b and 8 at the surface of substrate 50 is in proximity to the junction between P-type RESURF layer 18 and N-type impurity region 1 on which the electric field is concentrated, the electric field concentration on region R3 can be effectively relaxed by selecting distance W3>distance W2.

In the present invention, only distances W1 and W2 need to satisfy the above relation (W1>W2), or only distances W2 and W3 need to satisfy the above relation (W3>W2).

Fifth Embodiment

Figure 17A:
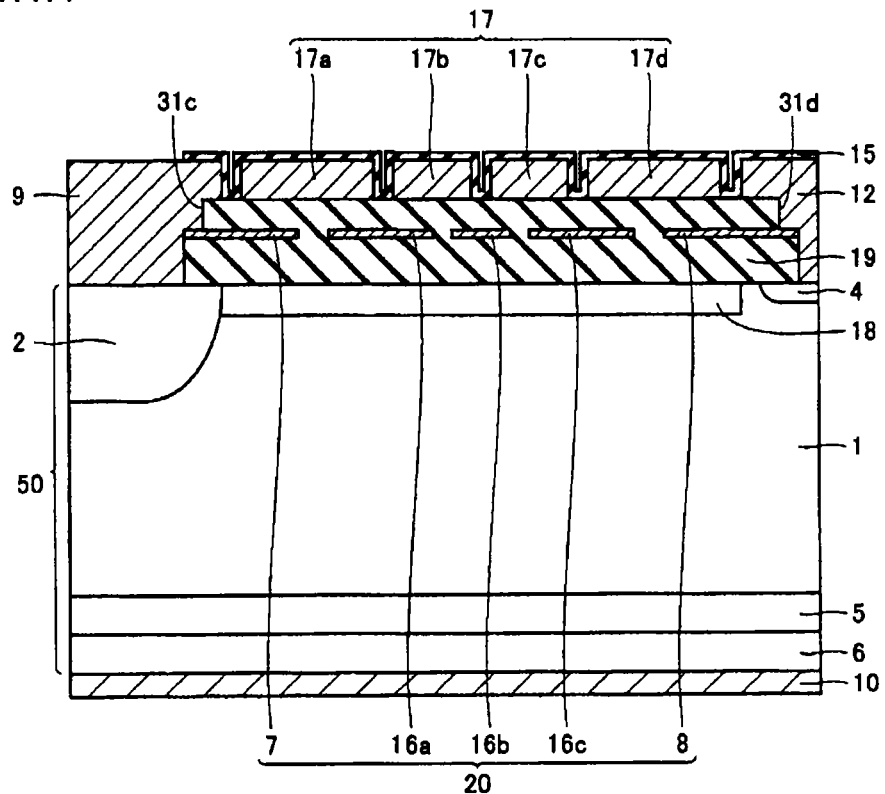
FIG. 17A is a sectional view schematically showing a structure of a semiconductor device according to a fifth embodiment of the present invention.
Figure 17B:
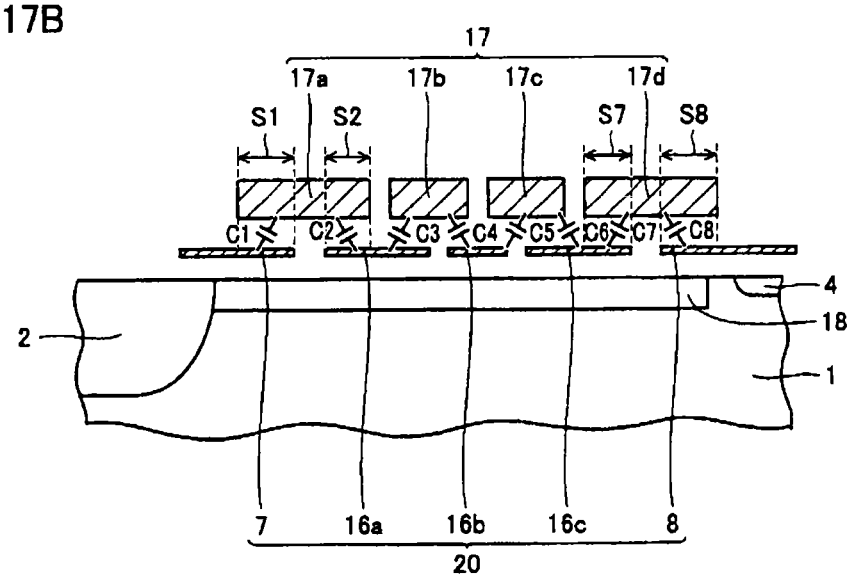
FIG. 17B a sectional view schematically showing capacitive couplings generated by plates in the semiconductor device according to the fifth embodiment of the present invention.

With reference to FIGS. 17A and 17B, a semiconductor device according to the present embodiment is different from that of the first embodiment in the structures of upper field plate 17 and lower field plate 20.

Upper field plate 17 includes plates 17a to 17d. Plates 17a to 17d are arranged substantially in parallel to the top face of substrate 50 in this order from P-well 2 to N-type channel stopper region 4 (rightward in FIGS. 17A and 17B) as viewed in a plan view. Lower field plate 20 includes plates 7, 16a to 16c and 8. Plates 7, 16a to 16c and 8 are arranged substantially in parallel to the top face of substrate 50 in this order from P-well 2 to N-type channel stopper region 4 as viewed in a plan view.

A capacitive element generated by upper field plate 17 (plate 17a) and plate 7 (first low-voltage-side lower plate) in lower field plate 20 located closest to the junction between P-type RESURF layer 18 and P-well 2 at the top face of substrate 50 is assumed to have a capacitance C1. A capacitive element generated by upper field plate 17 (plate 17a) and plate 16a (second low-voltage-side lower plate) adjacent to plate 7 at a position farther from P-well 2 than plate 7 (rightward in FIGS. 17A and 17B) is assumed to have a capacitance C2. A capacitive element generated by upper field plate 17 (plate 17d) and plate 8 (first high-voltage-side lower plate) in lower field plate 20 located closest to the junction between N-type impurity region 1 and P-type RESURF layer 18 at the top face of substrate 50 is assumed to have a capacitance C8. A capacitive element generated by upper field plate 17 (plate 17d) and plate 16c (second high-voltage-side lower plate) adjacent to plate 8 at a position closer to P-well 2 than plate 8 (leftward in FIGS. 17A and 17B) is assumed to have a capacitance C7. Capacitance C1 is greater than or equal to capacitance C2, and capacitance C8 is greater than or equal to capacitance C7.

In addition, a capacitive element generated by plates 16a and 17b is assumed to have capacitance C3. A capacitive element generated by plates 16b and 17b is assumed to have capacitance C4. A capacitive element generated by plates 16c and 17c is assumed to have capacitance C5. A capacitive element generated by plates 16c and 17d is assumed to have capacitance C6. Preferably, capacitances C1 to C8 have relations as expressed by Equations (3) and (4) as follows:

$$C1 \geq C2 \geq C3 \geq C4 \quad (3)$$

$$C8 \geq C7 \geq C6 \geq C5 \quad (4)$$

Values of capacitances C1 to C8 may be selected by surface area S of parallel plates based on Equation (2). More specifically, the relation of capacitance C1≥capacitance C2 may be satisfied by selecting a surface area S1 of a region of plate 7 facing plate 17a to be greater than or equal to a surface area S2 of a region of plate 16a facing plate 17a (S1≥S2). The relation of capacitance C8≥capacitance C7 may be satisfied by selecting a surface area S8 of a region of plate 8 facing plate 17d to be greater than or equal to a surface area S7 of a region of plate 16c facing plate 17d (S8≥S7). Selecting surface areas S1, S2, S7 and S8 to satisfy the above-mentioned relations facilitates selection of values of capacitances C1, C2, C7 and C8 of the capacitive elements without an increase in the fabrication steps.

The remaining structure of the semiconductor device is similar to that of the semiconductor device according to the first embodiment. Like reference characters denote like parts throughout the drawings, and the same description will not be repeated.

The semiconductor device according to the present embodiment achieves effects similar to those of the semiconductor device according to the first embodiment. In addition, since the capacitive element generated by plates 7 and 17a at the surface of substrate 50 is located closest to the junction between P-well 2 and P-type RESURF layer 18 on which the electric field is concentrated, selecting capacitance C1≥capacitance C2 relatively increases a voltage load on lower field plate 20 located in proximity to the middle portion of P-type RESURF layer 18, allowing the electric field concentration on the junction between P-well 2 and P-type RESURF layer 18 to be distributed to the middle portion of P-type RESURF layer 18. This results in effective relaxation of the electric field concentration. Similarly, since the capacitive element generated by plates 8 and 17d at the surface of substrate 50 is located closest to the junction between P-type RESURF layer 18 and N-type impurity region 1 on which the electric field is concentrated, selecting capacitance C8≥capacitance C7 relatively increases a voltage load on lower field plate 20 located in proximity to the middle portion of P-type RESURF layer 18, allowing the electric field concentration on the junction between P-type RESURF layer 18 and N-type impurity region 1 to be distributed to the middle portion of P-type RESURF layer 18. This results in effective relaxation of the electric field concentration.

In the present invention, only capacitances C1 and C2 need to satisfy the above relation (C1>C2), or only capacitances C7 and C8 need to satisfy the above relation (C8>C7).

Sixth Embodiment

Figure 18:
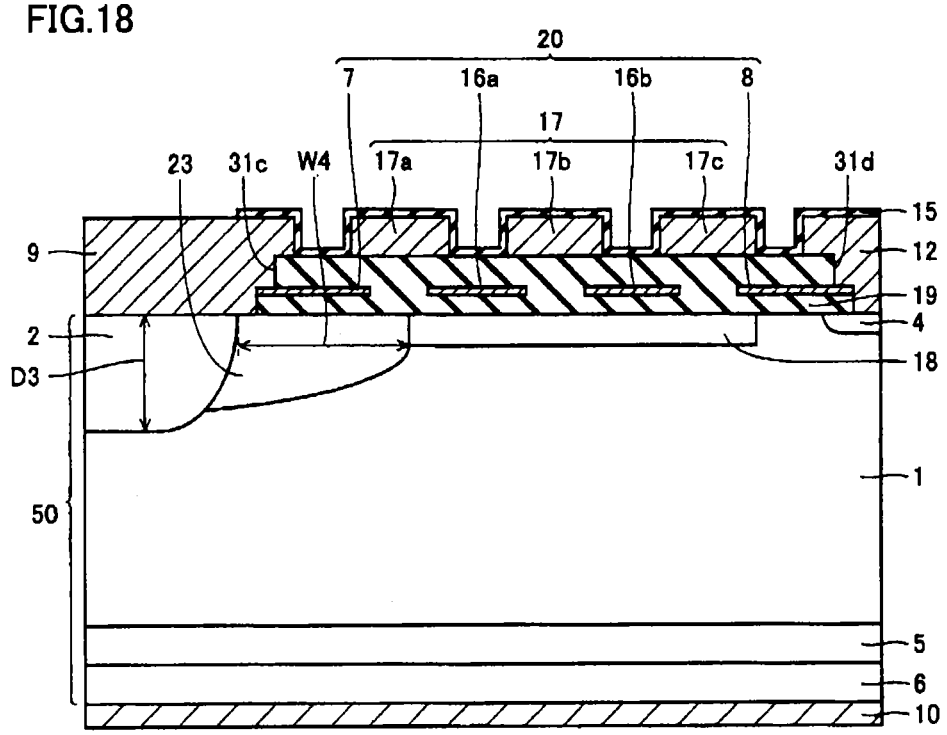
FIG. 18 is a sectional view schematically showing a structure of a semiconductor device according to a sixth embodiment of the present invention.

With reference to FIG. 18, a semiconductor device according to the present embodiment is different from that of the first embodiment in that a P-type buffer region 23 (buffer region) is provided.

P-type buffer region 23 is in contact with P-well 2 (well region) and P-type RESURF layer 18. P-type buffer region 23 has a P-type impurity concentration lower than that of P-well 2 and higher than that of P-type RESURF layer 18. In addition, P-type buffer region 23 has a width W4 at the top face of substrate 50 greater than a depth D3 of P-well 2.

The remaining structure of the semiconductor device is similar to that of the semiconductor device according to the first embodiment. Like reference characters denote like parts throughout the drawings, and the same description will not be repeated.

The semiconductor device according to the present embodiment achieves effects similar to those of the semiconductor device according to the first embodiment, and the following additional effects.

For example, in the semiconductor device shown in FIG. 2, once the electric field concentrations on the junction between P-well 2 and P-type RESURF layer 18 and the junction between P-type RESURF layer 18 and N-type impurity region 1 are relaxed by upper field plate 17 and lower field plate 20, the semiconductor device, upon receipt of a large reverse voltage, breaks down at a point (indicated by X in FIG. 2) having a small curvature on the boundary between P-well 2 and N-type impurity region 1, rather than at the junction between P-well 2 and P-type RESURF layer 18 and the junction between P-type RESURF layer 18 and N-type impurity region 1. This is because, when a reverse voltage is applied, the depletion layer is unlikely to extend at the position having a small curvature as indicated by point X. Therefore, P-type buffer region 23 is provided to increase the curvature of the position indicated by X in FIG. 2, allowing further improvement in the breakdown voltage of the semiconductor device.

Seventh Embodiment

Figure 19:
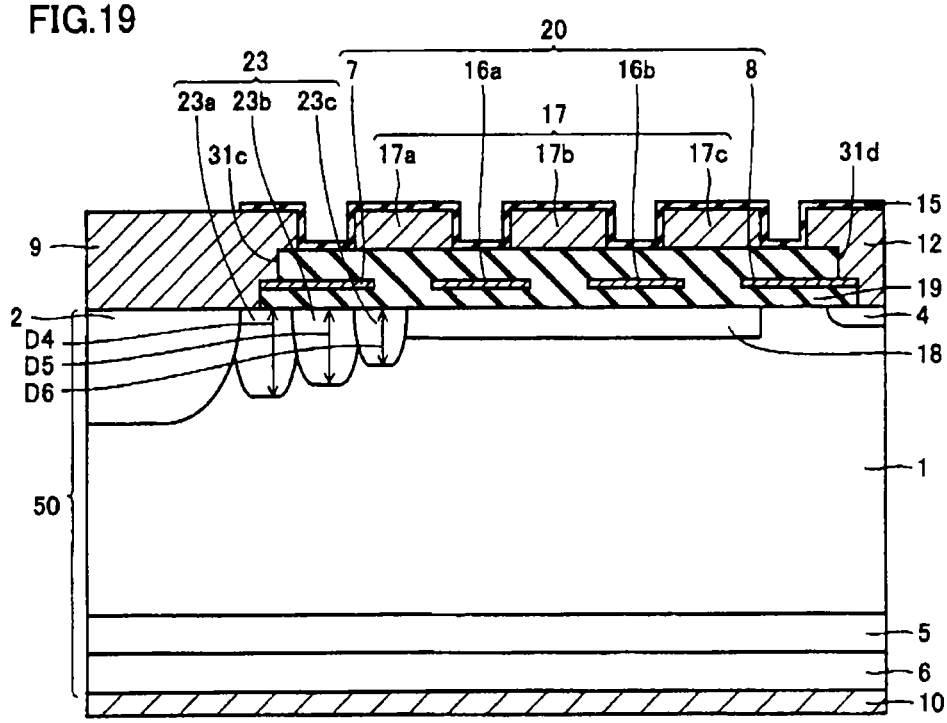
FIG. 19 is a sectional view schematically showing a structure of a semiconductor device according to a seventh embodiment of the present invention.

With reference to FIG. 19, a semiconductor device according to the present embodiment is different from that of the sixth embodiment in that P-type buffer region 23 includes a plurality of P-type impurity regions 23a to 23c (buffer impurity regions). P-type buffer region 23 may include an arbitrary number of P-type impurity regions.

P-type impurity regions 23a to 23c are in contact with one another, and arranged in this order from P-well 2 toward P-type RESURF layer 18 (rightward (toward the outer peripheral side) in FIG. 19) at the top face of substrate 50. P-type impurity regions 23a to 23c have, at the surface of substrate 50, depths and P-type impurity concentrations decreasing from P-well 2 toward P-type RESURF layer 18. More specifically, P-type impurity region 23a has a depth D4 and a P-type impurity concentration Ca smaller than a depth D5 and a P-type impurity concentration Cb of P-type impurity region 23b, respectively (D4>D5 and Ca>Cb). P-type impurity region 23b has depth D5 and P-type impurity concentration Cb smaller than a depth D6 and a P-type impurity concentration Cc of P-type impurity region 23c, respectively (D5>D6 and Cb>Cc).

The remaining structure of the semiconductor device is similar to that of the semiconductor device according to the sixth embodiment. Like reference characters denote like parts throughout the drawings, and the same description will not be repeated.

Figure 20:
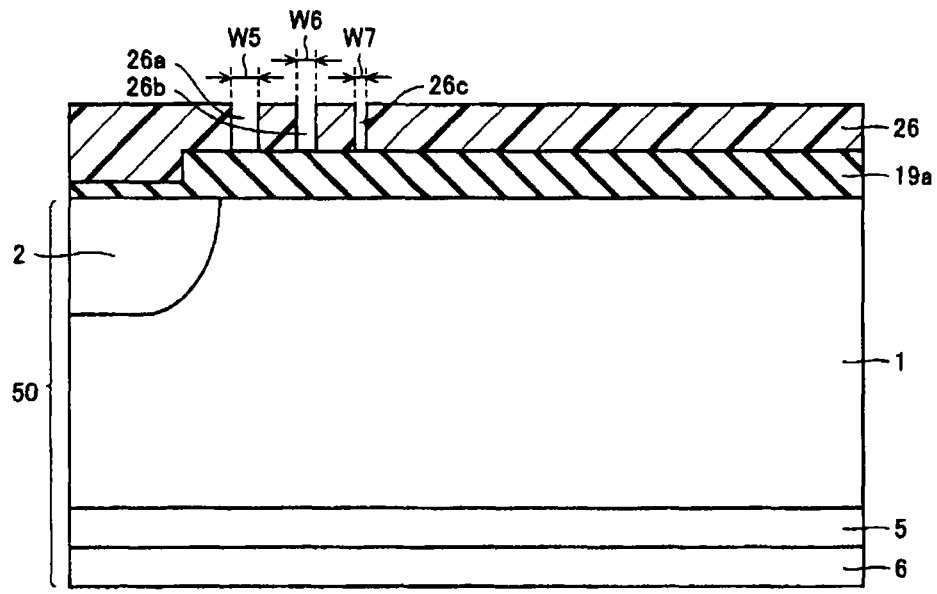
FIGS. 20 to 22 are sectional views respectively showing first to third steps of a fabrication method of the semiconductor device according to the seventh embodiment of the present invention.

An example of a fabrication method of the semiconductor device according to the present embodiment will now be described with reference to FIGS. 20 to 22.

First, steps similar to those of the fabrication method according to the second embodiment shown in FIGS. 7 to 9 are performed. With reference to FIG. 20, a resist is then applied on insulation film 19a to be patterned by typical photolithography, thereby forming a resist 26 on insulation film 19a. Resist 26 has openings 26a to 26c having widths W5 to W7, respectively. Width W5 is greater than width W6, and width W6 is greater than width W7. Widths W5 to W7 of openings 26a to 26c are respectively selected to be smaller than diffusion depths D4 to D6 of P-type impurity ions in a heat treatment performed in a step shown in FIG. 21 which will be described later.

The top face of substrate 50 is then doped with P-type impurity ions using resist 26 as a mask. Since width W5 is greater than width W6, and width W6 is greater than width W7, the total amount of P-type impurity ions introduced through opening 26a is greater than the total amount of P-type impurity ions introduced through opening 26b, and the total amount of P-type impurity ions introduced through opening 26b is greater than the total amount of P-type impurity ions introduced through opening 26c.

Figure 21:
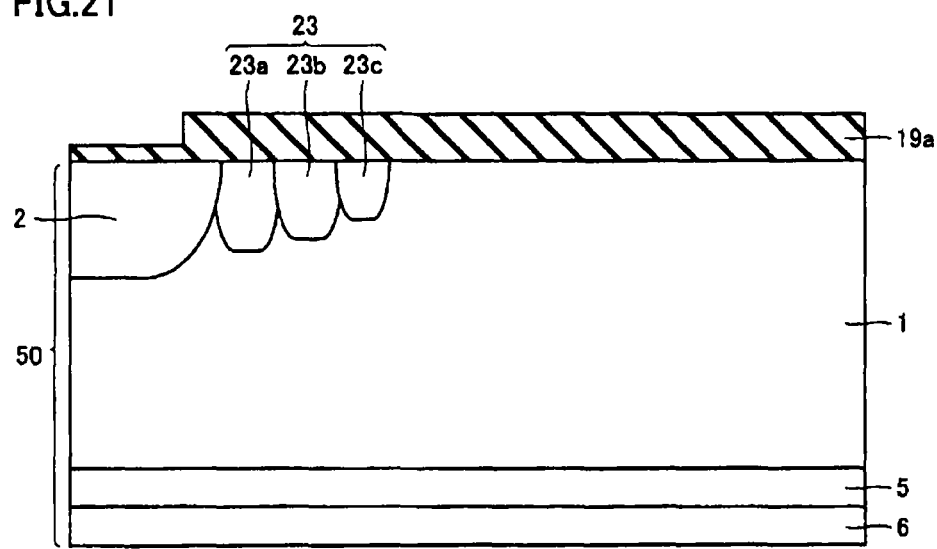

With reference to FIG. 21, resist 26 is removed, and substrate 50 is subjected to a heat treatment. P-type impurity ions introduced into the top face of substrate 50 are thermally diffused to form P-type impurity regions 23a to 23c. Herein, the distance between each of openings 26a to 26c in the step shown in FIG. 20 has previously been designed appropriately based on the diffusion length of P-type impurity ions in the heat treatment. This achieves a continuous decrease in P-type impurity concentrations in a direction parallel to the top face of substrate 50 (in a lateral direction in FIG. 21) at the boundary surface between P-type impurity regions 23a and 23b and the boundary surface between P-type impurity regions 23b and 23c, which prevents a local increase or decrease in P-type impurity concentrations at these boundary surfaces. In addition, P-type impurity regions 23a to 23c will have P-type impurity concentrations corresponding to widths W5 to W7 of openings 26a to 26c, respectively.

Figure 22:
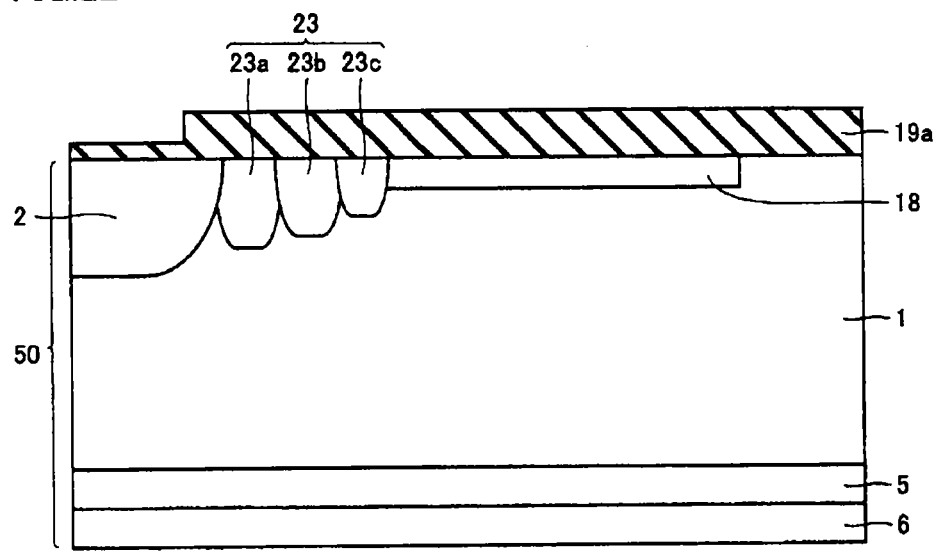

With reference to FIG. 22, a predetermined region is then selectively doped with P-type impurity ions by typical photolithography. The P-type impurity ions transmit through insulation film 19a to be introduced into the surface of substrate 50. Substrate 50 is then subjected to a heat treatment. P-type RESURF layer 18 is thereby formed at the surface of substrate 50 so as to make contact with P-type impurity region 23c.

Subsequently, steps similar to those of the fabrication method according to the second embodiment shown in FIGS. 11 to 14 are performed, and the semiconductor device according to the present embodiment is completed.

The semiconductor device and the fabrication method thereof according to the present embodiment achieve effects similar to those of the semiconductor device according to the sixth embodiment. In addition, the decrease in average P-type impurity concentrations in P-type buffer region 23 from P-well 2 toward P-type RESURF layer 18 achieves effective relaxation of the electric field concentration on the junction between P-well 2 and P-type RESURF layer 18. Moreover, forming P-type impurity regions 23a to 23c in a single step achieves simplified fabrication steps.

Eighth Embodiment

Figure 23:
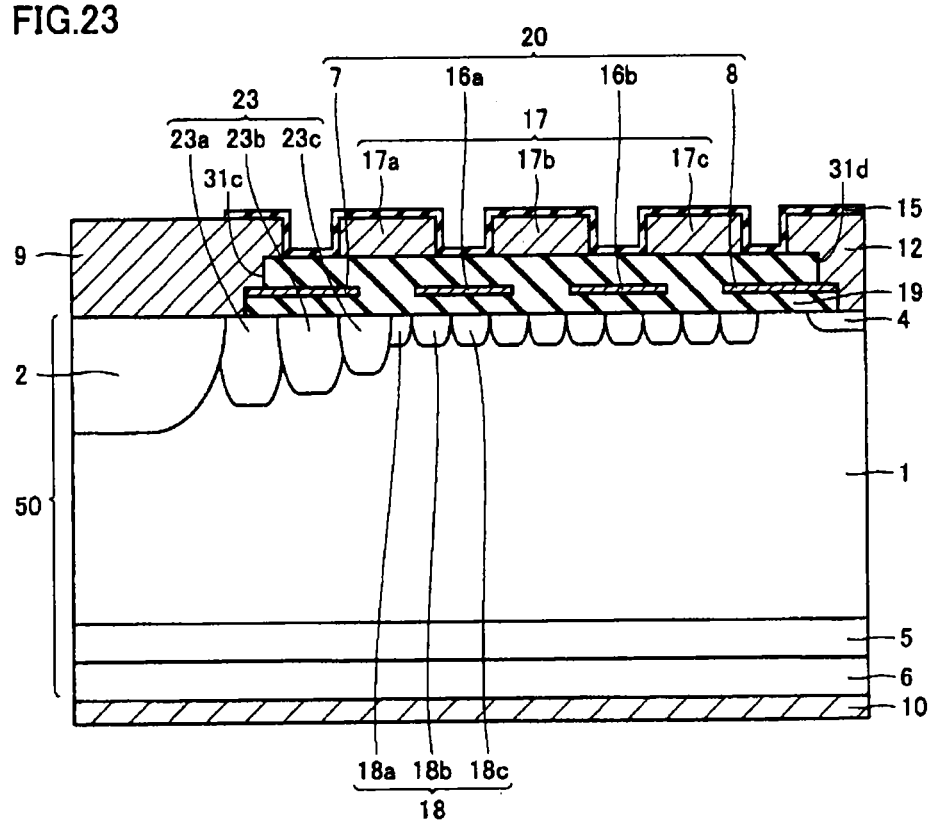
FIG. 23 is a sectional view schematically showing a structure of a semiconductor device according to an eighth embodiment of the present invention.

With reference to FIG. 23, a semiconductor device according to the present embodiment is different from that of the seventh embodiment in that P-type RESURF layer 18 includes a plurality of P-type impurity regions 18a to 18c (RESURF impurity regions). P-type RESURF layer 18 may include an arbitrary number of P-type impurity regions (ten P-type impurity regions are illustrated in FIG. 23).

P-type impurity regions 18a to 18c are in contact with one another, and arranged in this order from P-well 2 toward N-type channel stopper region 4 (rightward (toward the outer peripheral side) in FIG. 23) at the top face of substrate 50. P-type impurity regions 18a to 18c are substantially identical in depth and P-type impurity concentration at the surface of substrate 50.

The remaining structure of the semiconductor device is similar to that of the semiconductor device according to the sixth embodiment. Like reference characters denote like parts throughout the drawings, and the same description will not be repeated.

Figure 24:
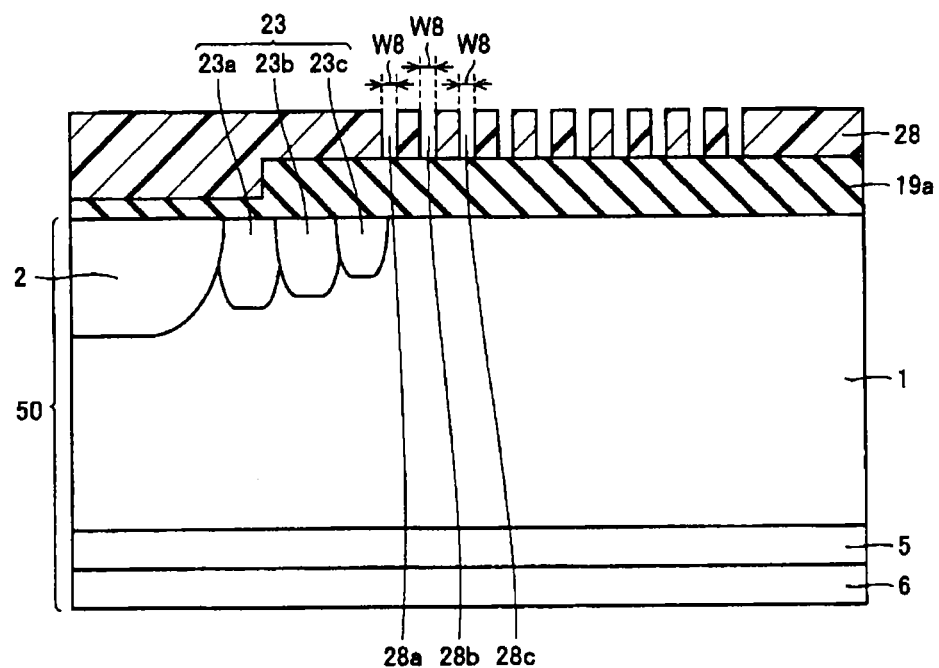
FIGS. 24 and 25 are sectional views respectively showing first and second steps of an example of a fabrication method of the semiconductor device according to the eighth embodiment of the present invention.

An example of a fabrication method of the semiconductor device according to the present embodiment will now be described with reference to FIGS. 24 and 25.

First, steps similar to those of the fabrication method according to the seventh embodiment shown in FIGS. 7 to 9 and 20 to 22 are performed. With reference to FIG. 24, a resist is then applied on insulation film 19a to be patterned by typical photolithography, thereby forming a resist 28 on insulation film 19a. Resist 28 has openings 28a to 28c having the same width W8. Width W8 of openings 28a to 28c is selected to be smaller than the diffusion depth of P-type impurity ions in a heat treatment performed in a step shown in FIG. 25 which will be described later.

Figure 25:
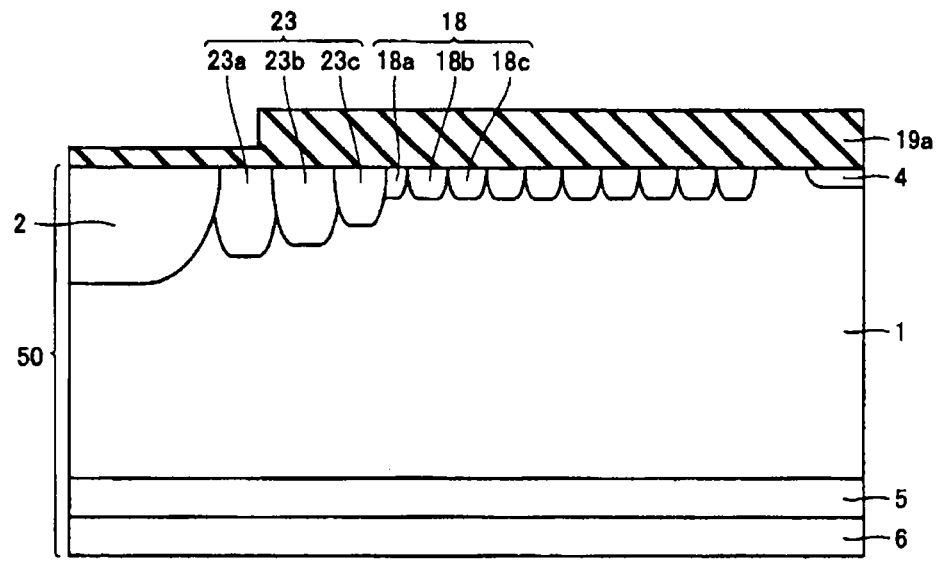

With reference to FIG. 25, the top face of substrate 50 is then doped with P-type impurity ions using resist 28 as a mask. Resist 28 is then removed, and substrate 50 is subjected to a heat treatment. The P-type impurity ions introduced into the top face of substrate 50 are thermally diffused to form respective P-type impurity regions 18a to 18c. Herein, the distance between each of openings 28a to 28c in the step shown in FIG. 24 has previously been designed appropriately based on the diffusion length of P-type impurity ions in the heat treatment. Accordingly, the P-type impurity concentrations are made constant in the direction parallel to the top face of substrate 50 (in the lateral direction in FIG. 25) at the boundary surface between P-type impurity regions 18a and 18b and the boundary surface between P-type impurity regions 18b and 18c, which prevents a local increase or decrease in the P-type impurity concentrations at these boundary surfaces. In addition, P-type impurity regions 18a to 18c will have P-type impurity concentrations corresponding to width W8 of openings 28a to 28c, respectively.

Subsequently, steps substantially similar to those of the fabrication method according to the second embodiment shown in FIGS. 11 to 14 are performed, and the semiconductor device according to the present embodiment is completed.

Figure 26:
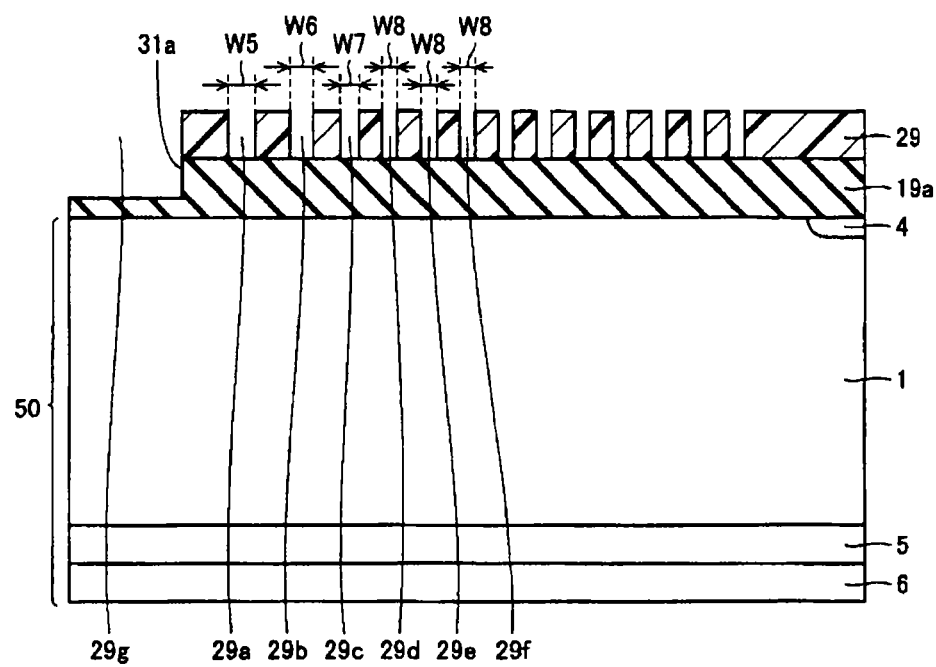
FIG. 26 is a sectional view showing another example of the fabrication method of the semiconductor device according to the eighth embodiment of the present invention.

Another example of a fabrication method of the semiconductor device according to the present embodiment will now be described with reference to FIG. 26.

First, steps similar to those of the fabrication method according to the second embodiment shown in FIGS. 7 and 8 are performed. With reference to FIG. 26, insulation film 19a is then selectively etched by typical photolithography and etching, thereby forming opening 31a in insulation film 19a at a position where opening 31c (FIG. 23) is to be formed. At the bottom of opening 31a, substrate 50 may be exposed, or insulation film 19a may be left. A resist is then applied on insulation film 19a to be patterned by typical photolithography, thereby forming a resist 29 on insulation film 19a. Resist 29 has openings 29a to 29g. Openings 29a to 29c have widths W5 to W7, respectively. Width W5 is greater than width W6, and width W6 is greater than width W7. Openings 29d to 29f have the same width W8. Widths W5 to W8 of openings 29a to 29f are selected to be smaller than the diffusion depth of P-type impurity ions in the heat treatment performed in the step shown in FIG. 25, respectively.

The top face of substrate 50 is then doped with P-type impurity ions using resist 29 as a mask. Resist 29 is then removed, and substrate 50 is subjected to a heat treatment. The P-type impurity ions introduced into the top face of substrate 50 are thermally diffused to form P-well 2, P-type impurity regions 23a to 23c and 18a to 18c as shown in FIG. 25. P-type impurity regions 23a to 23c and 18a to 18c will have P-type impurity concentrations corresponding to widths W5 to W8 of openings 29a to 29f, respectively.

Subsequently, steps substantially similar to those of the fabrication method according to the second embodiment shown in FIGS. 11 to 14 are performed, and the semiconductor device according to the present embodiment is completed.

The semiconductor device and the fabrication method thereof according to the present embodiment achieve effects similar to those of the semiconductor device according to the seventh embodiment. In addition, the decrease in average P-type impurity concentrations in P-type buffer region 23 from P-well 2 toward P-type RESURF layer 18 achieves effective relaxation of the electric field concentration on the junction between P-well 2 and P-type RESURF layer 18. Moreover, forming P-type impurity regions 23a to 23c in a single step can simplify the fabrication steps. Furthermore, forming P-well 2, P-type impurity regions 23a to 23c and 18a to 18c in a single step will further simplify the fabrication steps.

It should be noted that the structures and fabrication methods according to the above-described first to eighth embodiments can be combined as appropriate. The termination structure according to the present invention is not limited to a termination structure of an IGBT, but may be applied to a termination structure of an element such as a diode, a MOS transistor or the like.

Figure 27:
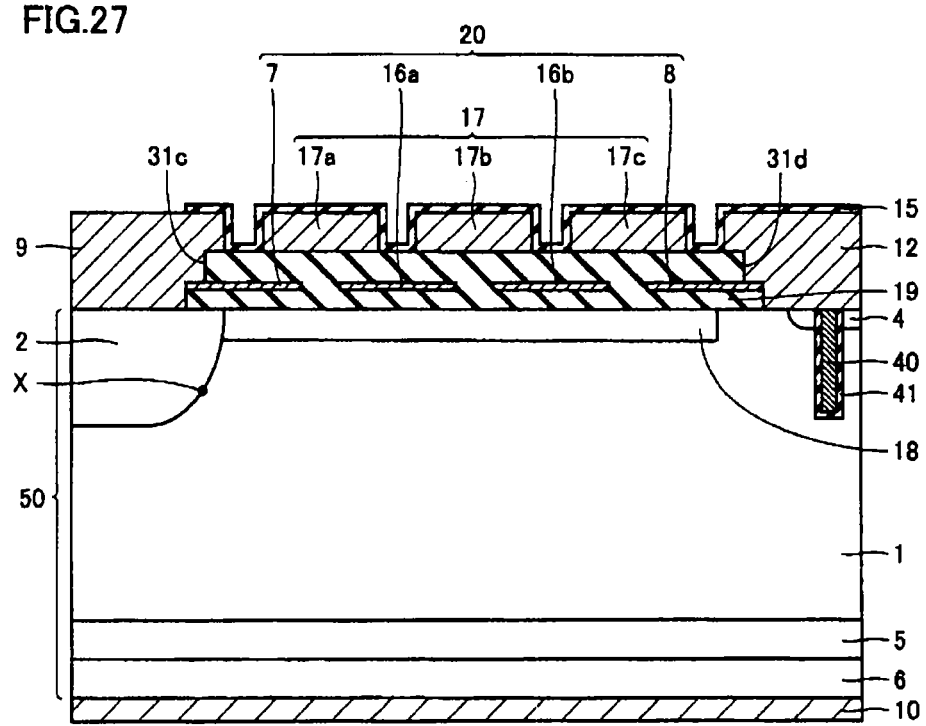
FIG. 27 is a sectional view schematically showing a structure of a semiconductor device according to the present invention when applied to a trench IGBT element structure.

For example, FIG. 27 is a sectional view schematically showing a structure of a semiconductor device according to the present invention when applied to a trench IGBT element structure. With reference to FIG. 27, a trench-burying layer 40 and an insulation film 41 electrically connected to N-type channel stopper electrode 12 are provided in N-type channel stopper region 4 at the top face of substrate 50. Trench-burying layer 40 made of a conductive material is surrounded by insulation film 41. Trench-burying layer 40 and insulation film 41 extend from the top face of substrate 50 into N-type impurity region 1.

Figure 28:
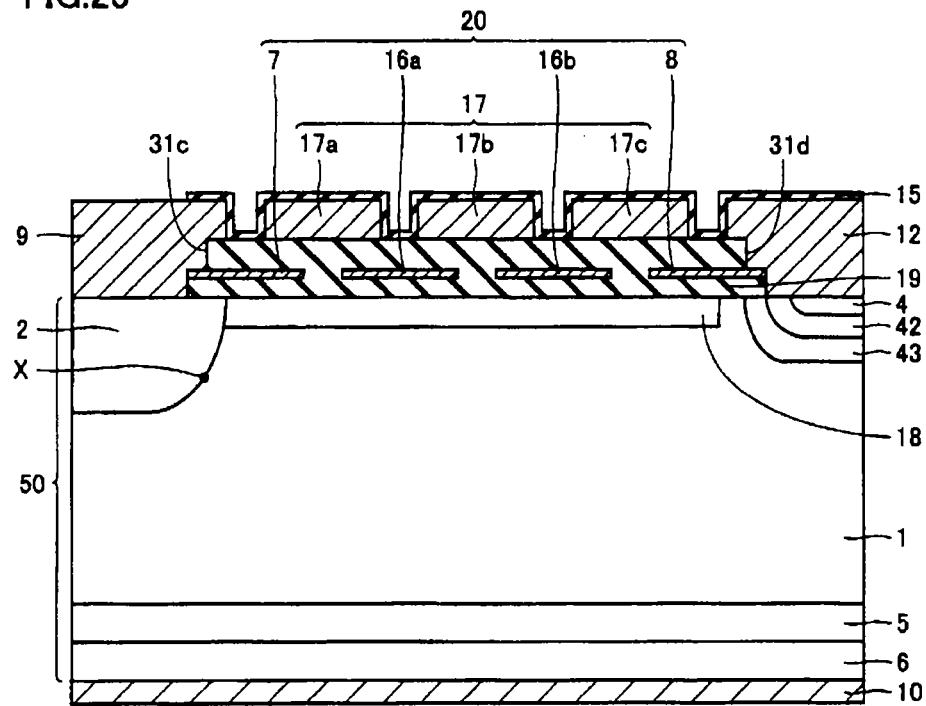
FIG. 28 is a sectional view schematically showing a structure of a semiconductor device according to the present invention when applied to an element structure including an N-carrier accumulation layer.
Figure 29:
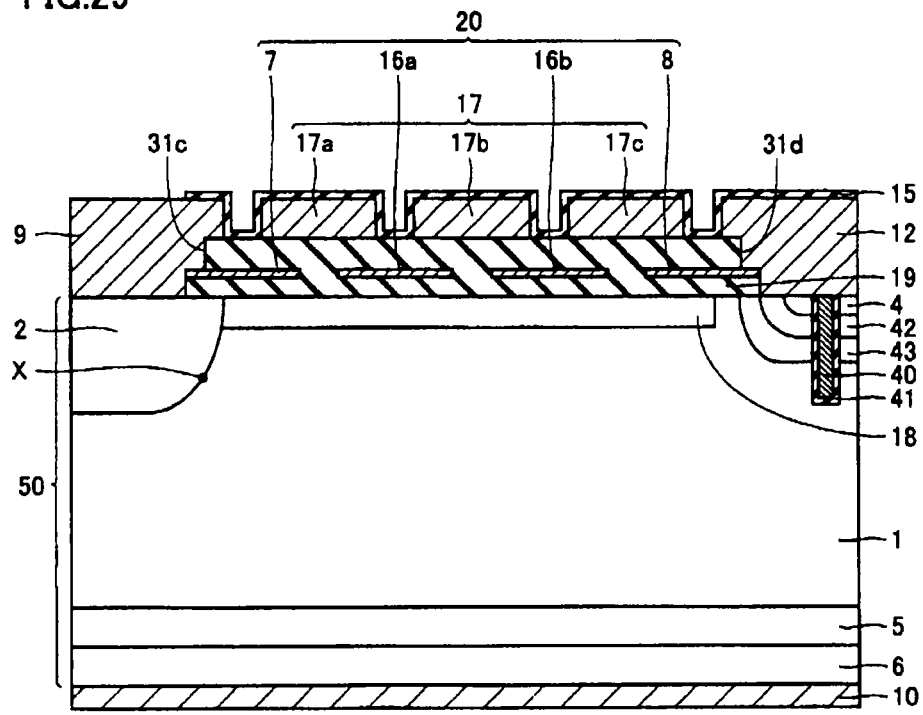
FIG. 29 is a sectional view schematically showing a structure of a semiconductor device according to the present invention when applied to a trench IGBT element structure including an N-carrier accumulation layer.

FIG. 28 is a sectional view schematically showing a structure of a semiconductor device according to the present invention when applied to an element structure including an N-carrier accumulation layer. With reference to FIG. 28, a P-type impurity region 43 is provided in N-type impurity region 1 at the top face of substrate 50, and an N-carrier accumulation layer 42 is provided in P-type impurity region 43 at the top face of substrate 50. N-type channel stopper region 4 is provided in N-carrier accumulation layer 42 at the top face of substrate 50. Alternatively, as shown in FIG. 29, the present invention may be applied to a trench IGBT element structure including an N-carrier accumulation layer.

Figure 30:
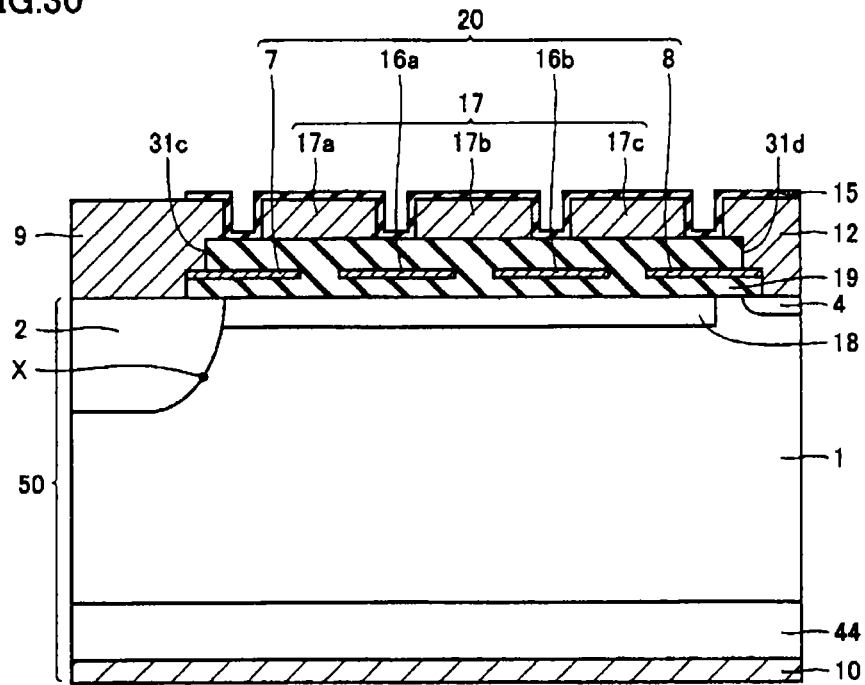
FIG. 30 is a sectional view schematically showing a structure of a semiconductor device according to the present invention when applied to an element structure including a diode and an N-type MOSFET.

FIG. 30 is a sectional view schematically showing a structure of a semiconductor device according to the present invention when applied to an element structure including a diode and an N-type MOSFET. With reference to FIG. 30, an N-type drain (cathode) region 44 is provided at the bottom face of substrate 50, instead of N-type buffer region 5 and P-type collector region 6 (FIG. 2). The effects of the present invention can also be obtained with the structures shown in FIGS. 27 to 30.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for fabricating a semiconductor device, comprising the steps of:

forming a first impurity region of a first conductivity type in a main surface of a substrate;

forming a RESURF (Reduced Surface Field) layer of a second conductivity type at said main surface in said first impurity region;

forming a second impurity region in contact with said RESURF layer and arranged at said main surface in said first impurity region, said second impurity region being of the second conductivity type and having an impurity concentration higher than an impurity concentration of said RESURF layer; and forming a plurality of field plates including (i) a plurality of lower field plates and (ii) an upper field plate located at a position farther from said substrate than said plurality of lower field plates in a whole area, at least one of said plurality of lower field plates being electrically connected to said first impurity region, at least another one of said plurality of lower field plates being electrically connected to said second impurity region, and said plurality of lower field plates being capable of generating a lower capacitive coupling with said substrate, said upper field plate being capable of generating an upper capacitive coupling with said plurality of lower field plates, said upper capacitive coupling having a capacitance greater than the capacitance of said lower capacitive coupling.

2. The method for fabricating a semiconductor device according to claim 1, wherein the step of forming said second impurity region includes a step of forming a well region and a step of forming a buffer region making contact with said well region and said RESURF layer, an impurity concentration of said buffer region being lower than an impurity concentration of said well region, the step of forming said buffer region includes a step of forming a plurality of buffer impurity regions of the second conductivity type arranged in said main surface and making contact with one another, and said plurality of buffer impurity regions are formed in a single step.

3. The method for fabricating a semiconductor device according to claim 2, wherein the step of forming said RESURF layer includes a step of forming a plurality of RESURF impurity regions of the second conductivity type arranged in said main surface and making contact with one another, and said well region, said plurality of buffer impurity regions and said plurality of RESURF impurity regions are formed in a single step.

* * * * *